(12) United States Patent
Lin et al.

(10) Patent No.: US 9,978,594 B1
(45) Date of Patent: May 22, 2018

(54) FORMATION METHOD OF SEMICONDUCTOR DEVICE STRUCTURE USING PATTERNING STACKS

(71) Applicant: TAIWAN SEMICONDUCTOR MANUFACTURING CO., LTD., Hsinchu (TW)

(72) Inventors: Li-Yen Lin, Wujie Township, Yilan County (CN); Ching-Yu Chang, Yuanshan Township, Yilan County (TW); Kuei-Shun Chen, Hsinchu (TW); Chin-Hsiang Lin, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days. days.

(21) Appl. No.: 15/352,118

(22) Filed: Nov. 15, 2016

(51) Int. Cl.
| | | |
|---|---|---|
| *H01L 21/027* | (2006.01) | |
| *H01L 21/311* | (2006.01) | |
| *G03F 7/09* | (2006.01) | |
| *G03F 7/004* | (2006.01) | |
| *G03F 7/16* | (2006.01) | |
| *G03F 7/038* | (2006.01) | |
| *G03F 7/20* | (2006.01) | |
| *G03F 7/32* | (2006.01) | |

(52) U.S. Cl.
CPC ........ *H01L 21/0273* (2013.01); *G03F 7/0045* (2013.01); *G03F 7/038* (2013.01); *G03F 7/0382* (2013.01); *G03F 7/091* (2013.01); *G03F 7/094* (2013.01); *G03F 7/162* (2013.01); *G03F 7/168* (2013.01); *G03F 7/2002* (2013.01); *G03F 7/322* (2013.01); *G03F 7/325* (2013.01); *H01L 21/31133* (2013.01); *H01L 21/31144* (2013.01)

(58) Field of Classification Search
CPC .......... G03F 7/168; G03F 7/094; G03F 7/091; G03F 7/0045; G03F 7/162; G03F 7/038; G03F 7/20; G03F 7/325; G03F 7/0382; G03F 7/322; H01L 21/0273; H01L 21/31133; H01L 21/31144
See application file for complete search history.

(56) References Cited

U.S. PATENT DOCUMENTS

| | | |
|---|---|---|
| 8,216,767 B2 | 7/2012 | Wang et al. |
| 8,323,870 B2 | 12/2012 | Lee et al. |
| 8,580,117 B2 | 11/2013 | Kao et al. |

(Continued)

OTHER PUBLICATIONS

U.S. Appl. No. 14/841,173, filed Aug. 31, 2015, Yang.

*Primary Examiner* — Kyoung Lee
*Assistant Examiner* — Christina Sylvia
(74) *Attorney, Agent, or Firm* — Birch, Stewart, Kolasch & Birch, LLP

(57) ABSTRACT

Formation methods of a semiconductor device structure are provided. The method includes forming an under layer over a substrate, forming a middle layer over the under layer, and forming a patterned upper layer over the middle layer. The patterned upper layer has a first opening exposing a portion of the middle layer. The method also includes etching the portion of the middle layer exposed by the first opening to form a second opening exposing a portion of the under layer, and etching the portion of the under layer exposed by the second opening of the middle layer. The method further includes forming pores in the middle layer before or during the etching of the portion of the under layer.

15 Claims, 24 Drawing Sheets

(56) References Cited

U.S. PATENT DOCUMENTS

| | | |
|---|---|---|
| 8,658,344 B2 | 2/2014 | Wang et al. |
| 8,715,919 B2 | 5/2014 | Chang et al. |
| 8,741,551 B2 | 6/2014 | Wu et al. |
| 9,140,987 B2 | 9/2015 | Chien et al. |
| 9,184,054 B1 | 11/2015 | Huang et al. |
| 2006/0105567 A1* | 5/2006 | Ramachandrarao ............... H01L 21/31105 438/637 |
| 2009/0269016 A1* | 10/2009 | Korampally ............ C01B 33/12 385/129 |
| 2011/0146775 A1* | 6/2011 | Kim ................ H01L 31/035218 136/255 |
| 2013/0323641 A1 | 12/2013 | Chang |
| 2014/0011133 A1 | 1/2014 | Liu et al. |
| 2014/0017615 A1 | 1/2014 | Chang |
| 2014/0017616 A1 | 1/2014 | Chang |
| 2014/0065843 A1 | 3/2014 | Chang et al. |
| 2014/0117563 A1 | 5/2014 | Yu et al. |
| 2014/0120459 A1 | 5/2014 | Liu et al. |
| 2014/0186773 A1 | 7/2014 | Chang |
| 2014/0255850 A1 | 9/2014 | Chang et al. |
| 2014/0272709 A1 | 9/2014 | Liu et al. |
| 2014/0272726 A1 | 9/2014 | Chang |
| 2014/0273521 A1 | 9/2014 | Wu et al. |
| 2015/0162280 A1 | 6/2015 | Pan et al. |
| 2015/0179511 A1 | 6/2015 | Hsieh et al. |
| 2016/0064239 A1 | 3/2016 | Shih et al. |

* cited by examiner

FORMATION METHOD OF SEMICONDUCTOR DEVICE STRUCTURE USING PATTERNING STACKS

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometric size (i.e., the smallest component that can be created using a fabrication process) has decreased.

As lithographic features are reduced, for example to below 40 nanometers (nm), high numerical aperture processes are needed to overcome the resolution limit. The use of a multilayer photoresist film scheme, such as a trilayer photoresist film scheme, appears to be promising in this regard. Specifically, multilayer photoresist films can provide for improvements in line edge roughness (LER) and line width roughness (LWR), among other benefits.

However, using multilayer schemes may pose challenges, especially with the decreasing technology nodes and pitch provided between features. Therefore, it is a challenge to improve the multilayer photoresist film scheme in order to improve the reliability of semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
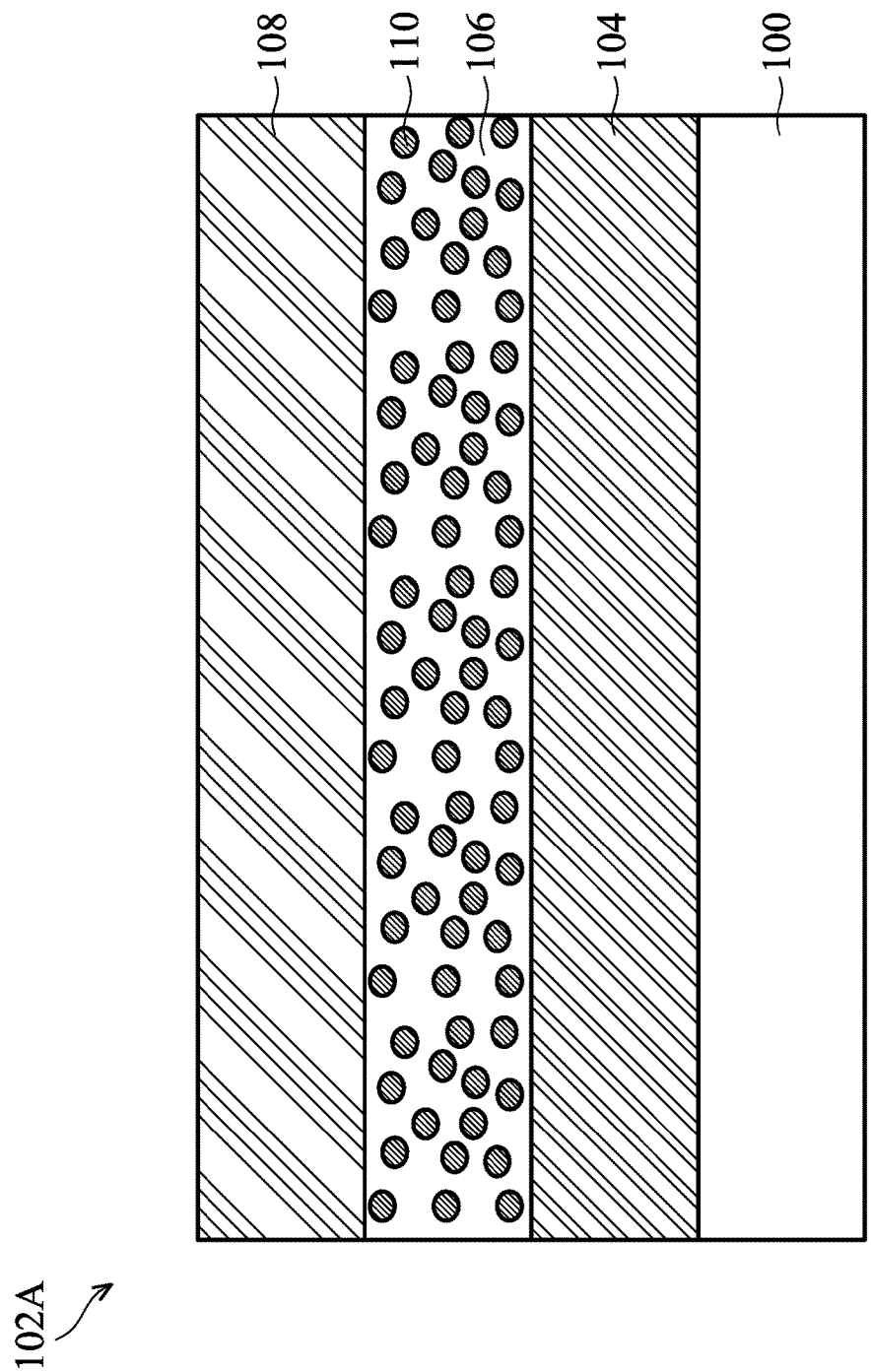
FIGS. 1A-1F are cross-sectional views of various stages of a process for forming a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows includes embodiments in which the first and second features are formed in direct contact, and may also include embodiments in which additional features may be formed between the first and second features, such that the first and second features may not be in direct contact. The present disclosure may repeat reference numerals and/or letters in some various examples. This repetition is for the purpose of simplicity and clarity and does not in itself dictate a relationship between some various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

FIGS. 1A-1E are cross-sectional views of various stages of a process for forming a semiconductor device structure, in accordance with some embodiments. As shown in FIG. 1A, a substrate 100 is received or provided, in accordance with some embodiments. In some embodiments, the substrate 100 includes a semiconductor substrate. In some embodiments, the semiconductor substrate is a bulk semiconductor substrate, such as a semiconductor wafer. For example, the semiconductor substrate is a silicon wafer. The semiconductor substrate includes silicon or another elementary semiconductor material such as germanium. In some other embodiments, the semiconductor substrate includes a compound semiconductor. The compound semiconductor includes gallium arsenide, silicon carbide, indium arsenide, indium phosphide, another suitable material, or a combination thereof.

In some embodiments, the semiconductor substrate is a semiconductor-on-insulator (SOI) substrate. The SOI substrate may be fabricated by using a separation by implantation of oxygen (SIMOX) process, a wafer bonding process, another applicable method, or a combination thereof.

In some embodiments, parts of or all of the substrate 100 in FIG. 1A are fabricated by a semiconductor manufacturing process flow such as a complementary metal-oxide-semiconductor (CMOS) technology process flow, and thus some processes are only briefly described herein. Furthermore, the substrate 100 includes various devices and features, such as additional transistors, bipolar junction transistors, resistors, capacitors, diodes, and fuses, but is simplified for a better understanding of the embodiments of the present disclosure.

In some embodiments, the substrate 100 in FIG. 1A is an intermediate structure fabricated during manufacturing of an integrated circuit, or a portion thereof. In some embodiments, the integrated circuit includes static random access memory (SRAM) and/or other logic circuits, passive components such as resistors, capacitors, and/or inductors, and active components such as P-channel field effect transistors (PFET), N-channel FET (NFET), metal-oxide semiconductor field effect transistors (MOSFET), complementary metal-oxide semiconductor (CMOS) transistors, bipolar junction transistors (BJT), high voltage transistors, high frequency transistors, diodes, other memory cells, and/or combinations thereof. In some embodiments, the substrate 100 includes one or more semiconductor devices (e.g., transistors), which are interconnected.

In some embodiments, various processes are used to form the various device elements mentioned above, including deposition, etching, implantation, photolithography, annealing, and/or other applicable processes.

In some embodiments, the semiconductor substrate is an un-doped substrate. However, in some other embodiments, the semiconductor substrate is a doped substrate such as a P-type substrate or an N-type substrate. In some embodiments, the semiconductor substrate includes various doped regions (not shown) depending on the design requirements of the semiconductor device. The doped regions include, for example, p-type wells and/or n-type wells. In some embodiments, the doped regions are doped with p-type dopants. For example, the doped regions are doped with boron or $BF_2$. In some embodiments, the doped regions are doped with n-type dopants. For example, the doped regions are doped with phosphor or arsenic. In some embodiments, some of the doped regions are p-type doped, and the other doped regions are n-type doped.

In some embodiments, the substrate 100 includes one or more of layers and/or features formed on/in the semiconductor substrate. The layers and/or features includes isolation regions such as shallow trench isolation (STI) features, conductive layers, insulating layers, and any other suitable features. In some embodiments, the substrate 100 has one layer or multiple layers (conductive layer, insulator layer) or features (source/drain regions, gate structures, interconnect lines and vias), formed on/in the semiconductor substrate.

In some embodiments, the substrate 100 includes one or more target layers, which are designed to be patterned. In some embodiments, the substrate 100 includes one or more target layers over a semiconductor substrate. Exemplary target layers may include gate layers, interconnect layers, and/or other suitable layers. In some embodiments, the method of the present disclosure is used to etch portions of the substrate 100 (e.g., such as in the formation of fins for a fin-type field effect transistor).

As shown in FIG. 1A, a patterning stack 102A is formed over the substrate 100, in accordance with some embodiments. In some embodiments, the patterning stack 102A is used to pattern the substrate 100. As shown in FIG. 1A, the patterning stack 102A is a trilayer patterning stack, in accordance with some embodiments. In some embodiments, the trilayer patterning stack is also referred to as a trilayer resist. However, in some other embodiments, the patterning stack is a bilayer patterning stack or contain another amount of layers.

As shown in FIG. 1A, the patterning stack 102A includes an under layer 104 over the substrate 100, a middle layer 106 over the under layer 104, and an upper layer 108 over the middle layer 106, in accordance with some embodiments. In some embodiments, the under layer 104 is an organic layer. In some embodiments, the middle layer 106 is a silicon-containing layer. In some embodiments, the upper layer 108 is a photoresist layer.

In some embodiments, the under layer 104 is a first (e.g., nearest the substrate 100) layer of the trilayer patterning stack 102A. In some embodiments, the under layer 104 is an organic layer and is made of organic material. In some embodiments, the organic material includes monomers or polymers that are not cross-linked. In some embodiments, the under layer 104 layer contains a material that is patternable and/or have a composition tuned to provide anti-reflection properties. In some embodiments, materials of the under layer 104 include a carbon backbone polymer.

In some embodiments, the polymer includes various monomers bonded together. In some embodiments, the polymer includes different monomers such as a cross-linking monomer and a monomer with chromophore units. In some embodiments, the monomer with the chromophore unit includes vinyl compounds (e.g., with conjugated double bonds) containing substituted and unsubstituted phenyl, substituted and unsubstituted anthracyl, substituted and unsubstituted phenanthryl, substituted and unsubstituted naphthyl, substituted and unsubstituted acridine, substituted and unsubstituted quinolinyl and ring-substituted quinolinyls (e.g., hydroxyquinolinyl), substituted and unsubstituted heterocyclic rings containing heteroatoms such as oxygen, nitrogen, sulfur, or combinations thereof, such as pyrrolidinyl, pyranyl, piperidinyl, acridinyl, quinolinyl. The substituents in these units may be any hydrocarbyl group and may further contain heteroatoms, such as, oxygen, nitrogen, sulfur, or combinations thereof, such as alkylenes, esters, ethers, combinations of these, or the like, with between 1 and 12 carbon atoms.

In some embodiments, the monomers with chromophore units include styrene, hydroxystyrene, acetoxystyrene, vinyl benzoate, vinyl 4-tert-butylbenzoate, ethylene glycol phenyl ether acrylate, phenoxypropyl acrylate, N-methyl maleimide, 2-(4-benzoyl-3-hydroxyphenoxy)ethyl acrylate, 2-hydroxy-3-phenoxypropyl acrylate, phenyl methacrylate, benzyl methacrylate, 9-anthracenylmethyl methacrylate, 9-vinylanthracene, 2-vinylnaphthalene, N-vinylphthalimide, N-(3-hydroxy)phenyl methacrylamide, N-(3-hydroxy-4-hydroxycarbonylphenylazo)phenyl methacrylamide, N-(3-hydroxyl-4-ethoxycarbonylphenylazo)phenyl methacrylamide, N-(2,4-dinitrophenylamino phenyl)maleimide, 3-(4-acetoaminophenyl)azo-4-hydroxystyrene, 3-(4-ethoxycarbonylphenyl)azo-acetoacetoxy ethyl methacrylate, 3-(4-hydroxyphenyl)azo-acetoacetoxy ethyl methacrylate, tetrahydroammonium sulfate salt of 3-(4-sulfophenyl)azoacetoacetoxy ethyl methacrylate combinations of these, or the like. However, any suitable monomer with chromophore units to absorb the impinging light and reduce or prevent the light from being reflected may alternatively be used, and all such monomers are fully intended to be included within the scope of the embodiments.

In some embodiments, the cross-linking monomer has an acid labile group. In some embodiments, the cross-linking monomer includes a hydrocarbon chain that also includes, e.g., a hydroxyl group, a carboxyl acid group, a carboxylic ester group, epoxy groups, urethane groups, amide groups, combinations of the, and the like. Specific examples of cross-linking monomers that may be utilized include polyhydroxystyrene, poly(hydroxynaphthalene), poly(meth)acrylates, polyarylates, polyesters, polyurethanes, alkyd resins (aliphatic polyesters), poly(hydroxystyrene-methylmethacrylate), homopolymers and/or copolymers obtained by polymerization of one (or more) of the following monomers: styrene, hydroxystyrene, hydroxyethyl (meth)acrylate, hydroxypropyl(meth)acrylate, methyl(meth) acrylate, ethyl(meth)acrylate, (meth)acrylic acid, poly (hydroxystyrene-styrene-methacrylate), poly(4-hydroxystyrene), or poly(pyromellitic dianhydride-ethylene glycol-propylene oxide).

In some embodiments, materials of the under layer 104 include a carbon backbone polymer. In some embodiments, the carbon backbone polymer has a carbon chain backbone. In some embodiments, the carbon chain backbone is an acrylic, a polyester, an epoxy novalac, a polysaccharide, a polyether, a polyimide, a polyurethane, or a mixture thereof.

In some embodiments, the under layer 104 includes photo-acid generator (PAG), thermal-acid generator (TAG), photo-base generator (PBG), thermal-base generator (TBG), and/or quencher. In some embodiments, the under layer 104 includes component including groups with a low Ohnishi number, such as aromatic groups.

In some embodiments, the under layer 104 includes a solvent. In some embodiments, the solvent includes propylene glycol monomethyl ether acetate (PGMEA), propylene glycol monoethyl ether (PGEE), propylene Glycol Methyl Ether (PGME), propylene glycol laurate (PGL), any other suitable solvent, or a combination thereof.

In some embodiments, the under layer 104 is baked to substantially remove the solvent. In some embodiments, the under layer 104 is a wet film before the baking process. In some embodiments, after the baking process, the solvent is substantially removed and the under layer 104 becomes a dry film.

In some embodiments, the under layer 104 is not formed. In some embodiments, the under layer 104 is deposited by a spin coating process. In some other embodiments, the under layer 104 is deposited by another applicable deposition process.

As shown in FIG. 1A, the middle layer 106 is deposited over the under layer 104, in accordance with some embodiments. In some embodiments, the middle layer 106 includes a silicon-containing layer (e.g., silicon hard mask material). In some embodiments, the middle layer 106 includes a silicon-containing inorganic polymer. In some embodiments, the middle layer 106 includes a siloxane polymer (e.g., a polymer having a backbone of O—Si—O—Si— etc.). The silicon ratio of the middle layer 106 material may be controlled to control the etch rate. In some other embodiments the middle layer 106 includes silicon oxide (e.g., spin-on glass (SOG)), silicon nitride, silicon oxynitride, polycrystalline silicon, a metal-containing organic polymer material that contains metal such as titanium, titanium nitride, aluminum, and/or tantalum; and/or other suitable materials.

In some embodiments, the middle layer 106 includes photo-acid generator (PAG), thermal-acid generator (TAG), photo-base generator (PBG), thermal-base generator (TBG), and/or quencher. In some embodiments, the middle layer 106 includes component including groups with a low Ohnishi number, such as aromatic groups. In some embodiments, the middle layer 106 includes component having chromophore unit. In some embodiments, the middle layer 106 includes component having crosslinker unit.

In some embodiments, the middle layer 106 is deposited by a spin coating process. In some other embodiments, the middle layer 106 is deposited by another applicable deposition process.

In some embodiments, the middle layer 106 is thermally baked for cross-linking, and does not contain a solvent. In some embodiments, the middle layer 106 includes a solvent such as propylene glycol monomethyl ether acetate (PGMEA), propylene glycol monoethyl ether (PGEE), propylene Glycol Methyl Ether (PGME), butanol, isobutanol, isopentanol, isopropyl alcohol, any other suitable solvent, or a combination thereof. In some embodiments, the middle layer 106 does not include a solvent with a boiling point higher than about 200° C.

In some embodiments, the middle layer 106 is baked to substantially remove the solvent. In some embodiments, the middle layer 106 is a wet film before the baking process. In some embodiments, after the baking process, the solvent is substantially removed such that the middle layer 106 is turned to be a dry film.

As shown in FIG. 1A, the middle layer 106 includes hydrophilic additives 110, in accordance with some embodiments. In some embodiments, the hydrophilic additives 110 includes poly(γ-caprolactone), poly(ethylene oxide), poly (propylene oxide), random poly(ethylene oxide-propylene oxide), alternating poly(ethylene oxide-propylene oxide), block poly(ethylene oxide-propylene oxide), cyclodextrin, any other suitable hydrophilic additive, or a combination thereof.

In some embodiments, the molecular weight of the hydrophilic additive 110 is in a range from about 1000 to about 10000, for example, from about 3000 to about 8000. In some embodiments, the weight percent of the hydrophilic additives 110 is in a range from about 1 wt % to about 40 wt %, for example, from about 10 wt % to about 30 wt %, based on the total weight of the middle layer 106.

In some embodiments, the term "about" means+/−20% of the stated value, more specifically+/−10% of the stated value, more specifically+/−5% of the stated value, more specifically+/−3% of the stated value, more specifically+/−2% of the stated value, more specifically+/−1% of the stated value and even more specifically+/−0.5% of the stated value. The stated value of the present disclosure is an approximate value. When there is no specific description, the stated value includes the meaning of "about".

As shown in FIG. 1A, the upper layer 108 is deposited over the middle layer 106, in accordance with some embodiments. In some embodiments, the upper layer 108 is a third, and top, layer of the trilayer patterning stack 102A. In some embodiments, the upper layer 108 is a photoresist (PR) layer or a photosensitive layer, which is operable to be patterned by a radiation.

In some embodiments, the chemical properties of the portion of the upper layer 108 struck by incident radiation changes in a manner that depends on the type of photoresist used. In some embodiments, the upper layer 108 is a suitable positive tone resist. Positive tone resist refers to a photoresist material that when exposed to radiation (typically UV light) becomes insoluble to a negative tone developer, while the portion of the photoresist that is not exposed (or exposed less) is soluble in the negative tone developer.

In some embodiments, the term "negative tone developer" refers to any suitable developer that selectively dissolves and removes areas that received no exposure dose or an exposure dose below a predetermined threshold exposure dose value. In some embodiments, the negative tone developer includes an organic solvent. In some embodiments, the organic solvent includes a solvent such as, for example, a ketone-based solvent, ester-based solvent, alcohol-based solvent, amide-based solvent, ether-based solvent, hydrocarbon-based solvent, and/or other suitable solvent.

In some embodiments, the upper layer 108 includes a carbon backbone polymer. In some embodiments, the upper layer 108 includes other suitable components such as a solvent and/or photo acid generators. In some embodiments, the upper layer 108 is a chemical amplified (CA) resist. In some embodiments, the photoresist layer includes a photo-acid generator (PAG) distributed in the photoresist layer. In some embodiments, when absorbing photo energy from an exposure process, the PAG forms a small amount of acid. In some embodiments, the resist includes a polymer material that varies its solubility to a developer when the polymer is reacted with this generated acid. In some embodiments, the chemical amplified resist is a positive tone resist. Examples of suitable PAGs include salts of sulfonium cations with sulfonates, salts of iodonium cations with sulfonates, sulfonyldiazomethane compounds, N-sulfonyloxyimide PAGs, benzoinsulfonate PAGs, pyrogallol trisulfonate PAGs, nitrobenzyl sulfonate PAGs, sulfone PAGs, glyoxime derivatives, triphenylsulfonium nonaflate, and/or other suitable PAGs.

In some embodiments, the upper layer 108 is deposited by a spin coating process. In some other embodiments, the upper layer 108 is deposited by another applicable deposition process.

In some embodiments, the thicknesses of the under layer 104, the middle layer 106 and the upper layer 108 are different from each other. In some embodiments, the thickness of the under layer 104 is in a range from about 200 nm to about 400 nm. In some embodiments, the thickness of the middle layer 106 is in a range from about 20 nm to about 40 nm. In some embodiments, the thickness of the upper layer 108 is in a range from about 80 nm to about 200 nm.

In some embodiments, the thickness of the under layer 104 refers to the distance from the top surface of the substrate 100 to the top surface of the under layer 104.

In some embodiments, the thickness of the middle layer 106 refers to the distance from the top surface of the under layer 104 to the top surface of the middle layer 106.

In some embodiments, the thickness of the upper layer 108 refers to the distance from the top surface of the middle layer 106 to the top surface of the upper layer 108.

In some embodiments, the refractive indices (n) of the under layer 104, the middle layer 106 and the upper layer 108 are different from each other. In some embodiments, the extinction coefficients (k) of the under layer 104, the middle layer 106 and the upper layer 108 are different from each other.

Figure 1B:
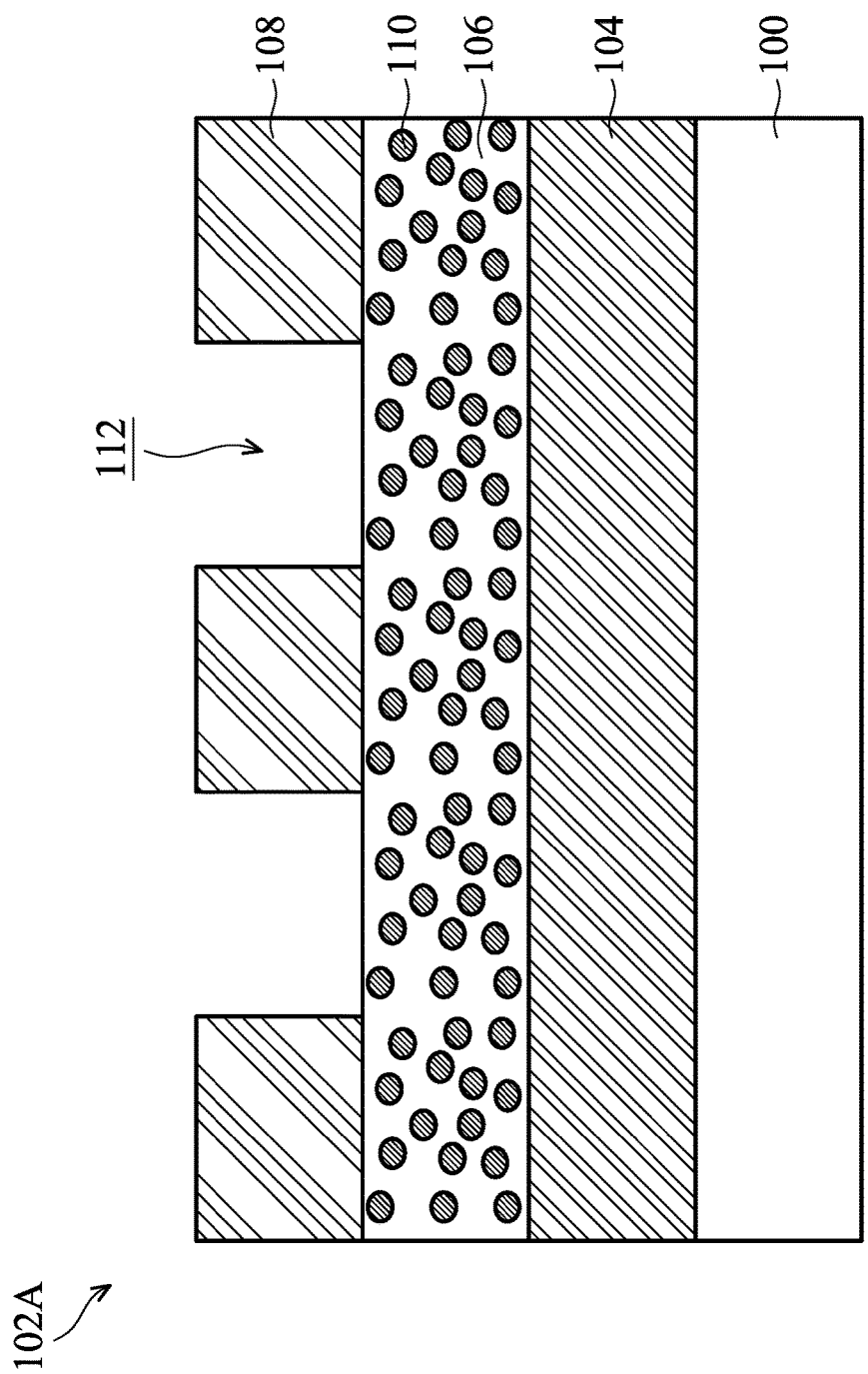

As shown in FIG. 1B, the upper layer 108 is patterned to form one (or more) first opening 112 in the upper layer 108, in accordance with some embodiments. In some embodiments, the first opening 112 exposes a portion of the middle layer 106. In some embodiments, the patterned upper layer 108 has a first pattern.

In some embodiments, one (or more) portion of the upper layer 108 is exposed to a radiation beam. In some embodiments, the radiation beam exposes the upper layer 108 in FIG. 1A over the substrate 100 using a lithography system that provides a pattern of the radiation according to an IC design layout. In some embodiments, a lithography system includes an ultraviolet (UV) radiation, a deep ultraviolet (DUV) radiation, an extreme ultraviolet (EUV) radiation, an X-ray radiation, and/or other suitable radiation types. In alternative embodiments, the lithography system includes a charged particle lithography system, such as an electron beam or an ion beam lithography system.

Afterward, the exposed upper layer 108 is developed to form a patterned upper layer 108. In some embodiments, a developer is applied to the exposed upper layer 108 to form the patterned upper layer 108.

In some embodiments, a negative tone developer is applied to the exposed upper layer 108. The term "negative tone developer" refers to a developer that selectively dissolves and removes areas that received no exposure dose or an exposure dose below a predetermined threshold exposure dose value.

In some embodiments, the developer includes an organic solvent or a mixture of organic solvents, such as methyl a-amyl ketone (MAK) or a mixture involving the MAK. In some other embodiments, a developer includes a water based developer, such as tetramethylammonium hydroxide (TMAH). In some embodiments, applying a developer includes spraying a developer on the exposed resist film, for example by a spin-on process. In some embodiments, the developer removes the non-exposed regions of the resist leaving the portions that have been exposed.

Figure 1C:
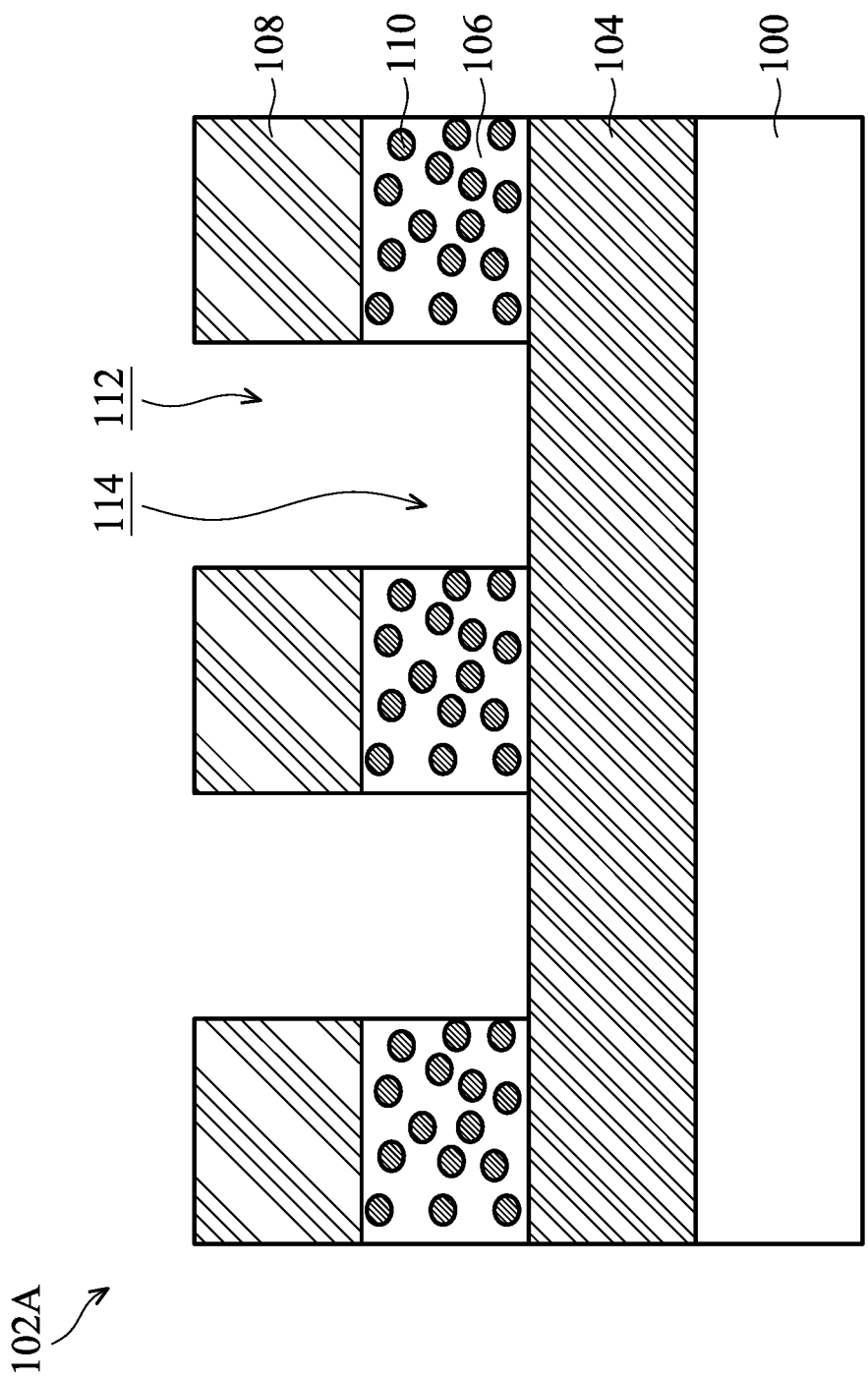

As shown in FIG. 1C, by using the patterned upper layer 108 as a mask, the portion of the middle layer 106 exposed by the first opening 112 of the patterned upper layer 108 is etched to form one (or more) second opening 114 in the middle layer 106, in accordance with some embodiments. In some embodiments, the second opening 114 exposes a portion of the under layer 104. In some embodiments, the etched middle layer 106 has a second pattern.

In some embodiments, an etching process is applied to remove material of the middle layer 106 exposed by the first opening 112 of the patterned upper layer 108. In some embodiments, the etch process is a dry etching process using etchant(s) including $CF_4$, $C_3F_8$, $C_4F_8$, $CHF_3$, and/or $CH_2F_2$. In some embodiments, the etching process is a reactive ion etching process, a plasma etching process, any other applicable etching process, or a combination thereof.

In some embodiments, the second opening 114 is aligned with the first opening 112. In some embodiments, the patterned upper layer 108 with the first opening 112 has a first pattern, and this first pattern is transferred to the middle layer 106 through the etching process. Therefore, in some embodiments, after the etching process, the etched middle layer 106 with the second opening 114 has a second pattern, and the second pattern is the same as the first pattern.

Figure 1D:
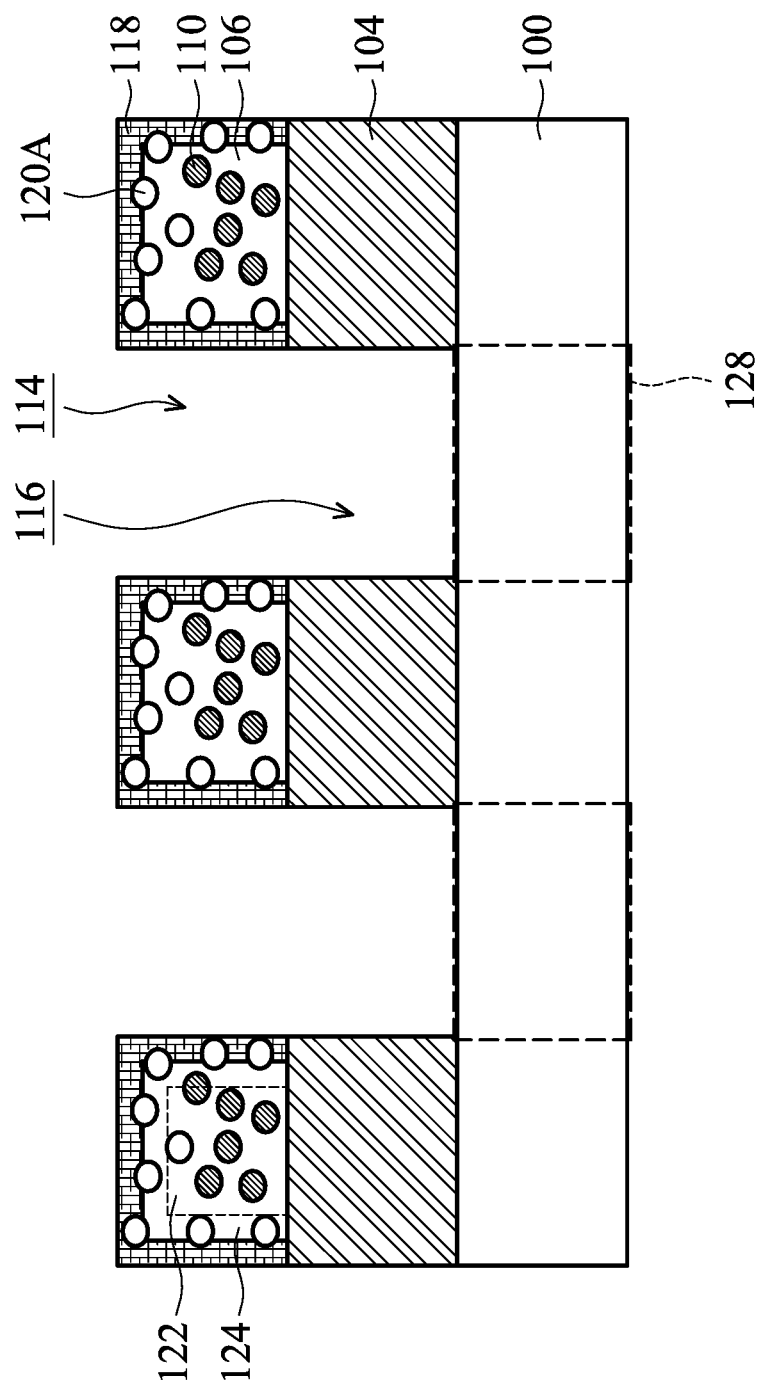

As shown in FIG. 1D, by using the middle layer 106 having the second opening 114 as a mask, the portion of the under layer 104 exposed by the second opening 114 is etched to form one (or more) third opening 116 in the under layer 104, in accordance with some embodiments. In some embodiments, the third opening 116 exposes a portion 128 of the substrate 100. In some embodiments, the etched under layer 104 has a third pattern.

In some embodiments, an etching process is applied to remove material of the under layer 104 exposed by the second opening 114 of the middle layer 106. In some embodiments, the etching process uses an oxygen dry etch. In some embodiments, the etching process is a reactive ion etching process, a plasma etching process, any other applicable etching process, or a combination thereof.

In some embodiments, the third opening 116 is aligned with the second opening 114. In some embodiments, the middle layer 106 with the second opening 114 has the second pattern, and this second pattern is transferred to the under layer 104 through the etching process. Therefore, in some embodiments, after the etching process, the etched under layer 104 with the third opening 116 has a third pattern, and the third pattern is the same as the second pattern of the middle layer 106.

As shown in FIG. 1D, during the etching process which etches the under layer 104, the upper layer 108 is removed, in accordance with some embodiments. As shown in FIG. 1D, during the etching process which etches the under layer 104, a surface layer 118 is formed at the surface of the middle layer 106, in accordance with some embodiments. In some embodiments, the surface layer 118 is positioned at the top surface and the side surface of the middle layer 106.

In some embodiments, if the etching process is an oxygen dry etching process, the surface layer 118 contain more oxygen than other portion of the middle layer 106, and is denser than other portion of the middle layer 106. In some embodiments, the surface layer 118 is more difficult to remove than other portions of the middle layer 106 in a subsequent process which is used to remove the middle layer 106 and the under layer 104.

As shown in FIG. 1D, multiple pores 120A are formed in the middle layer 106 during the etching process which etches the portion of the under layer 104 exposed by the second opening 114 of the middle layer 106.

In some embodiments, during the etching process which etches the under layer 104, the etch rate of the hydrophilic additives 110 is higher than the etch rate of components of the middle layer 106 other than the hydrophilic additives 110. Therefore, during the etching process which etches the under layer 104, a portion of the hydrophilic additives 110 is removed from the middle layer 106 to form the pores 120A in the middle layer 106.

In some embodiments, during the etching process which etches the under layer 104, about 1% to about 20% of the hydrophilic additives 110 are removed. In some embodiments, during the etching process which etches the under layer 104, about 5% to about 10% of the hydrophilic additives 110 are removed.

In some cases, during a subsequent removal process which is used to remove the middle layer 106 and the under layer 104, since the middle layer 106 contains the pores 120A, the etchant osmosis may be enhanced due to the greater surface area resulting from the pores 120A. Therefore, the middle layer 106 containing the pores 120A has a better wet strippability and may be efficiently removed.

The formation of residue of the middle layer 106 over the substrate 100 resulting from an incomplete removal of middle layer 106 may be reduced or prevented. In particular, the formation of residue of the middle layer 106 over the substrate 100 resulting from an incomplete removal of the surface layer 118 of the middle layer 106 may be reduced or prevented. Therefore, the yield of the manufacturing process may be improved. As a result, the quality and reliability of the semiconductor device structure formed by the method of the present disclosure are significantly improved.

In some embodiments, the pores 120A have a total pore volume, and the ratio of the total pore volume to the total volume of the middle layer 106 is in a range from about 0.1% to about 10%, for example, from about 1% to about 5%.

In some cases, if the ratio of the total pore volume to the total volume of the middle layer 106 is too great, for example greater than 10%, the structural reliability of the middle layer 106 may be negatively affected. In some cases, if the middle layer 106 contains hydrophilic additives 110 with weight percent more than 40 wt %, or if more than 20% of the hydrophilic additives 110 are removed during the etching process which etches the under layer 104, the ratio of the total pore volume to the total volume of the middle layer 106 may be too great.

However, in some cases, if the ratio of the total pore volume to the total volume of the middle layer 106 is too small, for example less than 0.1%, the middle layer 106 may not be efficiently removed during a subsequent removal process which is used to remove the middle layer 106 and the under layer 104. In some cases, if the middle layer 106 contains hydrophilic additives 110 with weight percent less than 1 wt %, or if less than 1% of the hydrophilic additives 110 are removed during the etching process which etches the under layer 104, the ratio of the total pore volume to the total volume of the middle layer 106 may be too small.

In some cases, during a subsequent removal process which is used to remove the middle layer 106 and the under layer 104, the hydrophilic additives 110 may enhance the penetration ability of the aqueous etchant into the middle layer 106. Therefore, the middle layer 106 containing the hydrophilic additives 110 has a better wet strippability and may be efficiently removed.

As shown in FIG. 1D, most of the pores 120A formed by removing the hydrophilic additives 110 are in the region adjacent to the top surface and the side surface of the middle layer 106, in accordance with some embodiments. As shown in FIG. 1D, some of the pores 120A are in the surface layer 118 of the middle layer 106, in accordance with some embodiments.

As shown in FIG. 1D, the middle layer 106 has an inner portion 122 and an outer portion 124 surrounding the inner portion 122, in accordance with some embodiments. As shown in FIG. 1D, in some embodiments, the pore density of pores 120A of the outer portion 124 is greater than that of the inner portion 122. In some embodiments, the pore density decreases along a direction from the top surface and the side surface of the middle layer 106 to the inner portion 122 of the middle layer 106.

In some embodiments, the distance between the surface of the middle layer 106 and the interface between the inner portion 122 and outer portion 124 is about 1% to about 20% times the thickness of the middle layer 106, for example, about 5% to about 10% times the thickness of the middle layer 106. In some embodiments, the thickness of the middle layer 106 refers to the distance from the top surface of the under layer 104 to the top surface of the middle layer 106.

Figure 1E:
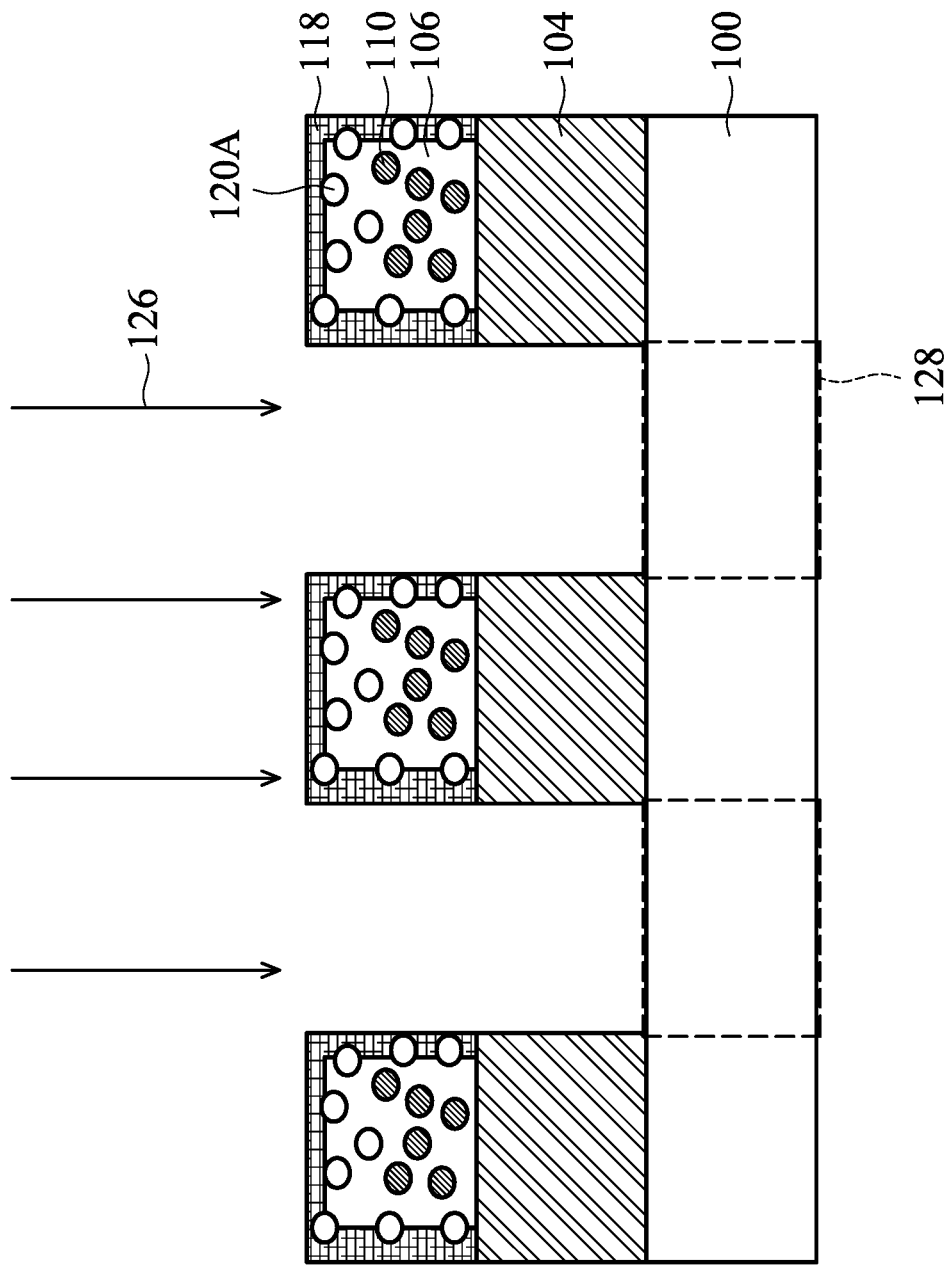

As shown in FIG. 1E, in some embodiments, one or more processes 126 are performed on the portion 128 of the substrate 100 exposed by the third opening 116 of the under layer 104, in accordance with some embodiments. In some embodiments, the substrate 100 is etched by using the under layer 104 having the third opening 116 as a mask to form one or more trenches, using a applicable etching process including a dry etch or a wet etch. In some embodiments, fins for a fin-type field effect transistor are formed in the substrate 100 by the etching process mentioned above.

In some other embodiments, the portion 128 of the substrate 100 exposed by the third opening 116 of the under layer 104 is implanted. In some other embodiments, a material layer such as a conductive layer, a semiconductor layer or a dielectric layer is deposited over the portion 128 of the substrate 100 exposed by the third opening 116 of the under layer 104. However, the embodiments of the present disclosure are not limit thereto. The process 126 may be any other applicable manufacturing process.

Figure 1F:
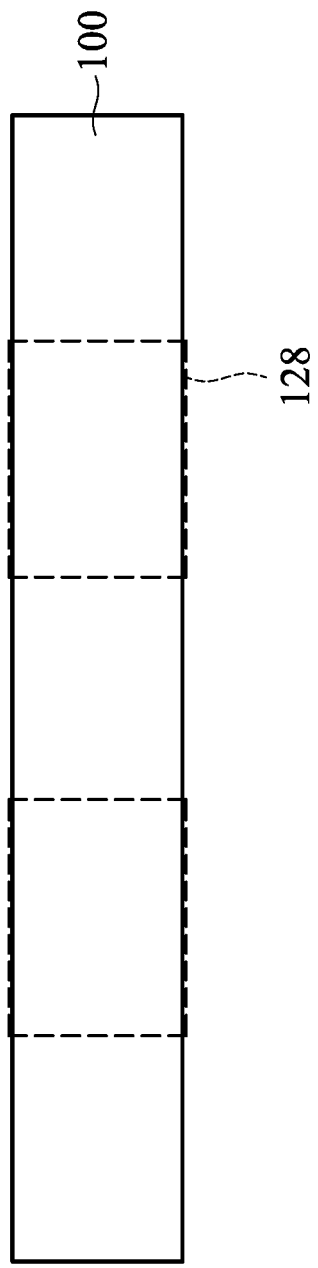

As shown in FIG. 1F, the middle layer 106 and the under layer 104 are removed. In some embodiments, the middle layer 106 and the under layer 104 are removed by a wet etching process using an aqueous etchant. In some embodiments, the aqueous etchant includes aqueous acidic solutions, aqueous basic solutions, or a mixture of $H_2O_2$ and the aqueous acidic solutions or aqueous basic solutions. In some embodiments, the aqueous acidic solutions include HF, $H_3PO_4$, HCl, $HNO_3$, $H_2SO_4$, $CH_3COOH$, any other suitable acidic solutions, or a combination thereof. In some embodiments, the aqueous basic solutions include $NH_4OH$, KOH, NaOH, tetramethyl ammonium hydroxide (TMAH), any other suitable acidic solutions, or a combination thereof.

In some cases, during the removal of the middle layer 106 and the under layer 104, since the middle layer 106 contains the pores 120A, the etchant osmosis may be enhanced due to the greater surface area resulting from the pores 120A. Therefore, the middle layer 106 containing the pores 120A has a better wet strippability and may be efficiently removed. In some cases, during the removal of the middle layer 106 and the under layer 104, since the middle layer 106 contains the hydrophilic additives 110, the penetration ability of the aqueous etchant into the middle layer 106 may be enhanced. Therefore, the middle layer 106 containing the hydrophilic additives 110 has a better wet strippability and may be efficiently removed. In some embodiments, the etching rate of the middle layer 106 containing the hydrophilic additives 110 and the pores 120A is about 450% greater than that of a middle layer which does not contain the hydrophilic additives and pores.

It should be noted that the exemplary embodiment set forth in FIGS. 1A-1F is merely for the purpose of illustration. In addition to the embodiment set forth in FIGS. 1A-1F, the pores may be formed by other methods such as those shown in FIGS. 2A-2I. This will be described in more detail in the following description. Therefore, the present disclosure and scope are not limited to the exemplary embodiment shown in FIGS. 1A-1F.

Note that the same or similar elements or layers corresponding to those of the semiconductor device are denoted by like reference numerals. In some embodiments, the same or similar elements or layers denoted by like reference numerals have the same meaning and will not be repeated for the sake of brevity.

Figure 2A:
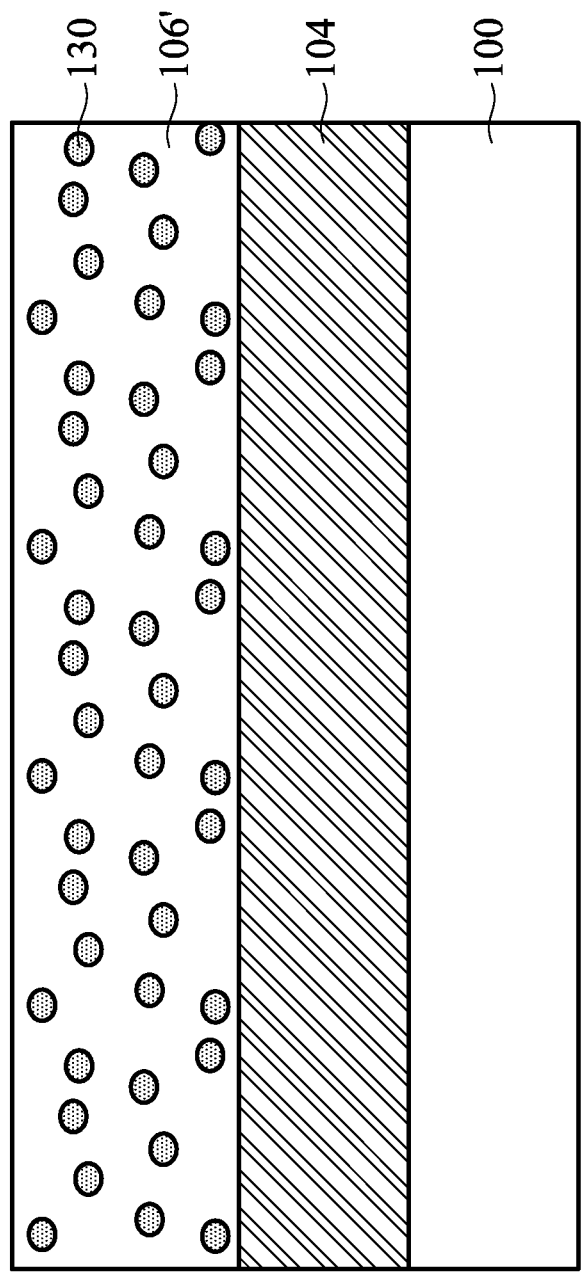
FIGS. 2A-2I are cross-sectional views of various stages of a process for forming a semiconductor device structure, in accordance with some embodiments.

As shown in FIG. 2A, after the under layer 104 is deposited over the substrate 100, a silicon-containing material layer 106' is deposited over the under layer 104, in accordance with some embodiments. In some embodiments, the silicon-containing material layer 106' includes the component which is used to form the subsequent middle layer (or the silicon-containing layer). In some embodiments, the silicon-containing material layer 106' includes a first solvent and a second solvent 130. In some embodiments, the under layer 104 is not formed.

In some embodiments, the boiling point of the second solvent 130 is higher than the boiling point of the first solvent. It should be noted that FIG. 2A only shows the second solvent 130, whereas the first solvent is not shown in FIG. 2A for the sake of brevity.

In some embodiments, the boiling point of the first solvent is in a range from about 80° C. to about 220° C., for example from about 100° C. to about 200° C. In some embodiments, the boiling point of the second solvent 130 is in a range from about 180° C. to about 320° C., for example from about 200° C. to about 300° C.

In some embodiments, the first solvent includes propylene glycol monomethyl ether acetate (PGMEA), propylene glycol monoethyl ether (PGEE), propylene Glycol Methyl Ether (PGME), butanol, isobutanol, isopentanol, isopropyl alcohol, any other suitable solvent with a boiling point ranging from about 80° C. to about 220° C., or a combination thereof.

In some embodiments, the second solvent 130 includes di(ethylene)glycol monomethyl ether, γ-butyrolactone, di(propylene)glycol monomethyl ether, hexamethylphosphoramide, tetradecane, tri(ethylene)glycol monomethyl ether, tri(propylene)glycol monomethyl ether, glycerol, tetra(ethylene)glycol monomethyl ether, any other suitable solvent with a boiling point ranging from about 180° C. to about 320° C., or a combination thereof.

In some embodiments, the silicon-containing material layer 106' does not include additives which may be removed during the etching process which etches the under layer 104 to form pores in the subsequent middle layer.

In some embodiments, the silicon-containing material layer 106' is deposited by a spin coating process. In some other embodiments, the silicon-containing material layer 106' is deposited by another applicable deposition process.

In some embodiments, the silicon-containing material layer 106' is a wet film and is also referred to as a silicon-containing material solution 106.

Figure 2B:
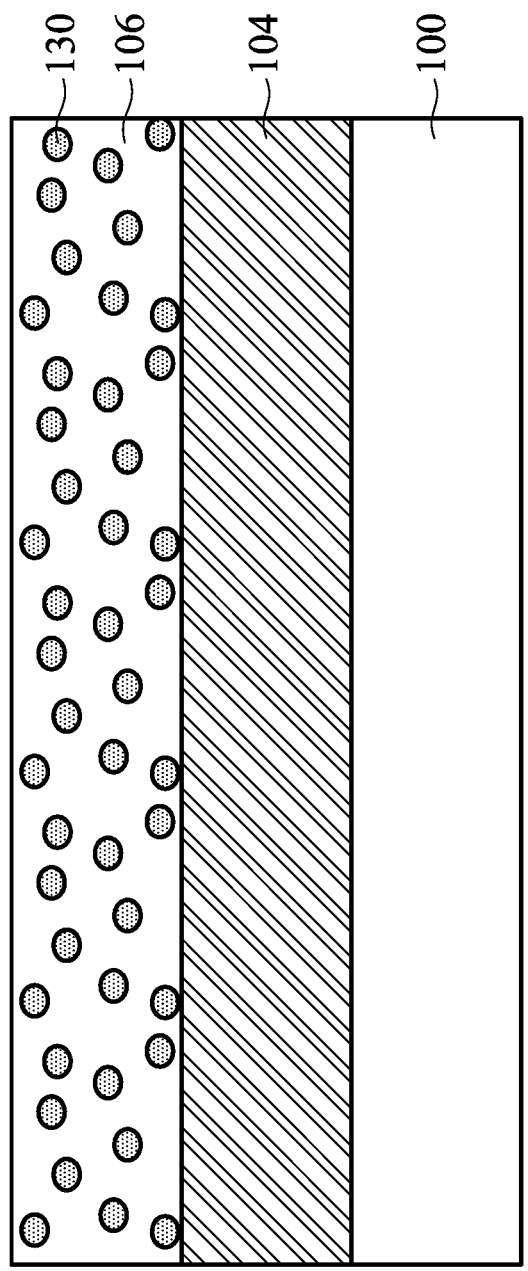

As shown in FIG. 2B, the silicon-containing material layer 106' is baked at a first temperature to remove the first solvent to form the middle layer 106 over the under layer 104, in accordance with some embodiments. In some embodiments, since the first solvent is removed from the silicon-containing material layer 106' during the baking process, the thickness of the middle layer 106 is less than the thickness of the silicon-containing material layer 106'.

In some embodiments, the first temperature is higher than or equal to the boiling point of the first solvent, and is less than the boiling point of the second solvent 130. Therefore, during the baking process at the first temperature, the first solvent is removed, while the second solvent 130 substantially remains. In some embodiments, the first temperature is in a range from about 80° C. to about 220° C., for example, from about 160° C. to about 200° C.

In some embodiments, the weight percent of the second solvent 130 is in a range from about 1 wt % to about 40 wt %, for example, from about 10 wt % to about 30 wt %, based on the total weight of the middle layer 106.

Figure 2C:
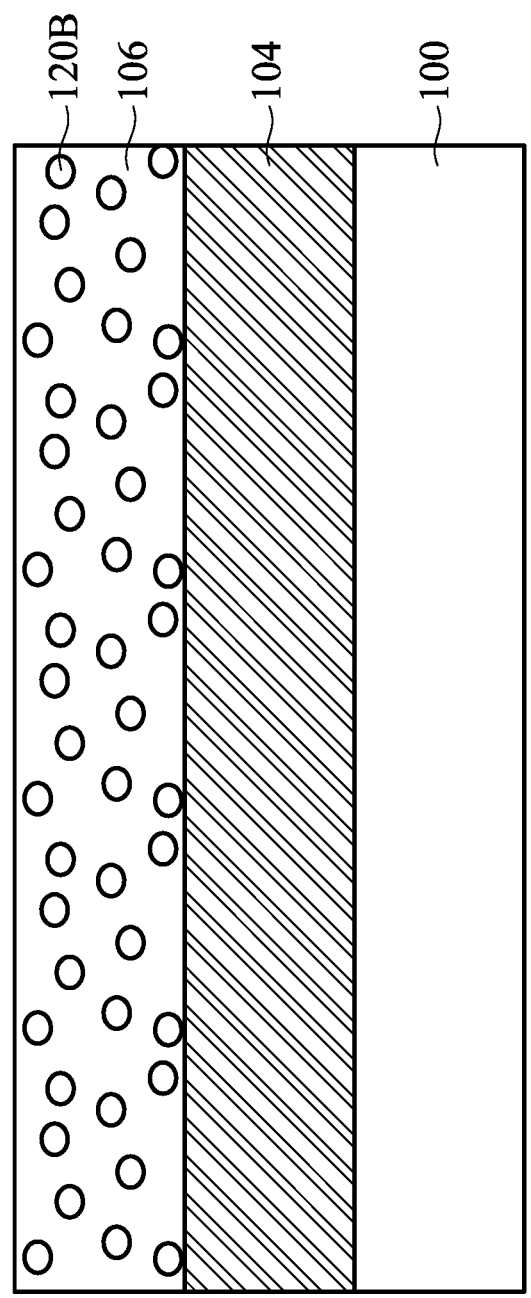

As shown in FIG. 2C, the middle layer 106 is baked at a second temperature to remove the second solvent 130 to form multiple pores 120B in the middle layer 106. In some embodiments, the second temperature is higher than the first temperature. In some embodiments, the second temperature is in a range from about 180° C. to about 320° C., for example, from about 200° C. to about 300° C. In some embodiments, the second temperature is higher than or equal to the boiling point of the second solvent 130.

As shown in FIG. 2C, the second solvent 130 is substantially removed during the baking process at the second temperature. In some embodiments, the pore density of the pores 120B formed by removing the second solvent 130 is uniform in the middle layer 106. In some embodiments, the middle layer 106 is baked and the pores 120B are formed before the formation of the subsequent patterned upper layer. In some embodiments, the pores 120B are formed in the middle layer 106 before the etching process which etches of a portion of the under layer 104.

In some cases, during a subsequent removal process which is used to remove the middle layer 106 and the under layer 104, since the middle layer 106 contains the pores 120B, the etchant osmosis may be enhanced due to the greater surface area resulting from the pores 120B. Therefore, the middle layer 106 containing the pores 120B has a better wet strippability and may be efficiently removed.

The formation of residue of the middle layer 106 over the substrate 100 resulting from an incomplete removal of middle layer 106 may be reduced or prevented. In particular, the formation of residue of the middle layer 106 over the substrate 100 resulting from an incomplete removal of the subsequent surface layer of the middle layer 106 may be reduced or prevented. Therefore, the yield of the manufacturing process may be improved. As a result, the quality and reliability of the semiconductor device structure formed by the method of the present disclosure are significantly improved.

In some embodiments, the pores 120B have a total pore volume, and the ratio of the total pore volume to the total volume of the middle layer 106 is in a range from about 0.1% to about 10%, for example, from about 1% to about 5%.

In some cases, if the ratio of the total pore volume to the total volume of the middle layer 106 is too great, for example greater than 10%, the structural reliability of the middle layer 106 may be negatively affected. In some cases, if the middle layer 106 contains more than 40 wt % of the second solvent 130, the ratio of the total pore volume to the total volume of the middle layer 106 may be too great.

However, in some cases, if the ratio of the total pore volume to the total volume of the middle layer 106 is too small, for example less than 0.1%, the middle layer 106 may not be efficiently removed during a subsequent removal process which is used to remove the middle layer 106 and the under layer 104. In some cases, if the middle layer 106 contains less than 1 wt % of the second solvent 130, the ratio of the total pore volume to the total volume of the middle layer 106 may be too small.

Figure 2D:
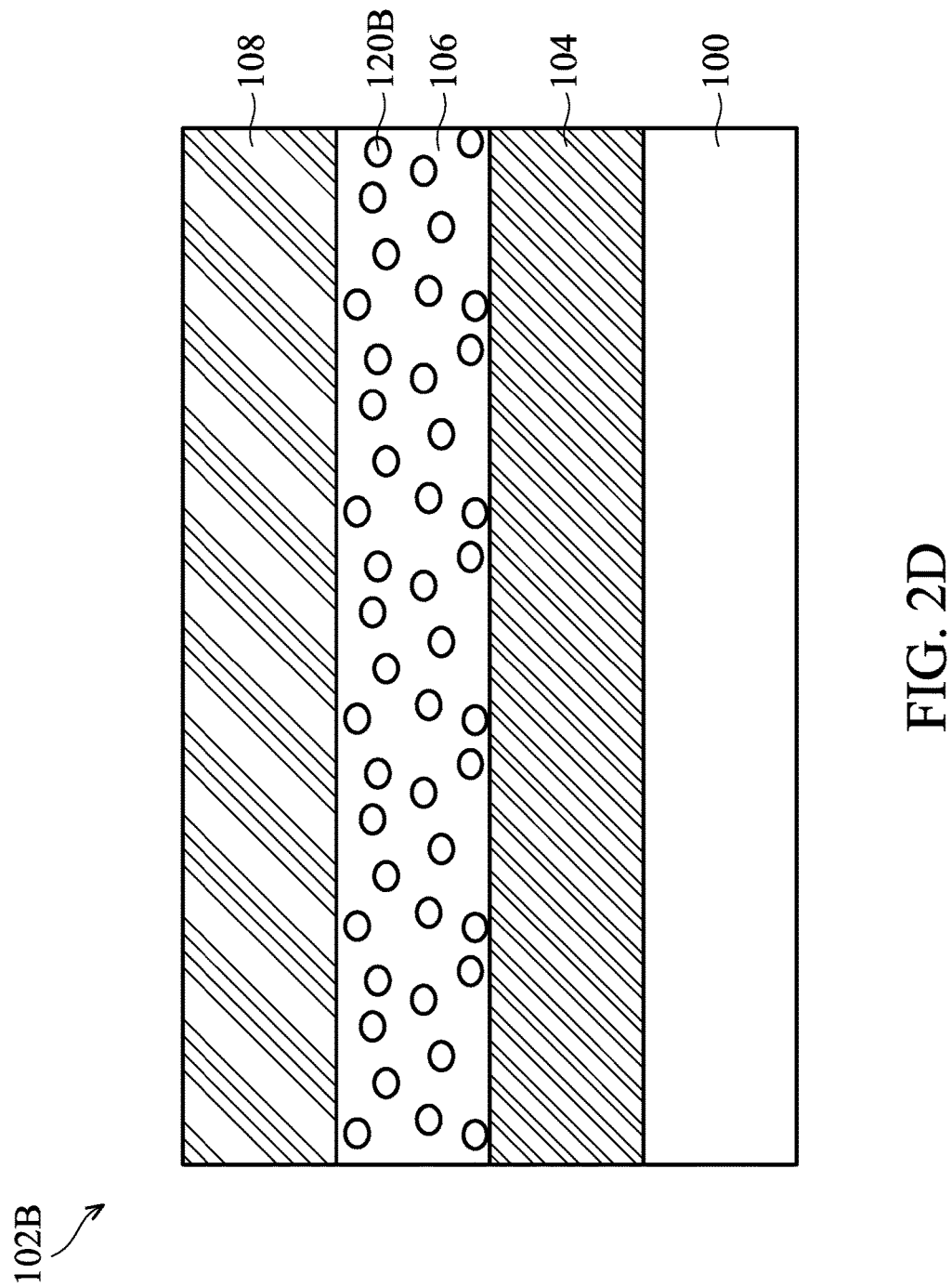
Figure 2E:
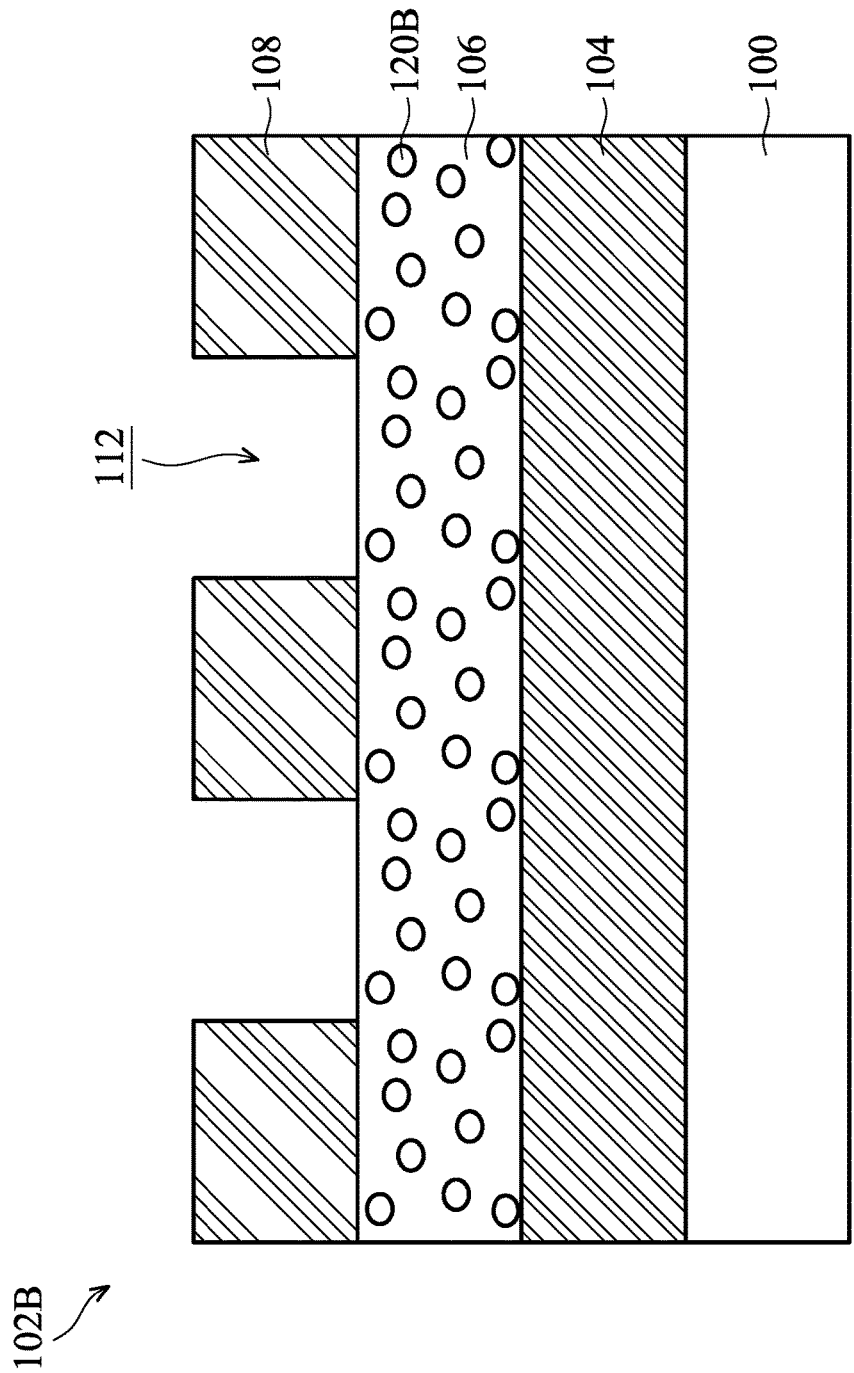

As shown in FIG. 2D, the upper layer 108 is deposited over the middle layer 106 to form a patterning stack 102B using a method that is the same as or similar to that in FIG. 1A, in accordance with some embodiments. Afterward, as shown in FIG. 2E, the upper layer 108 is patterned and developed to form one (or more) first opening 112 in the upper layer 108, in accordance with some embodiments. In some embodiments, the upper layer 108 is patterned and developed using a method that is the same as or similar to that in FIG. 1B. In some embodiments, the first opening 112 exposes a portion of the middle layer 106. In some embodiments, the patterned upper layer 108 has a first pattern.

Figure 2F:
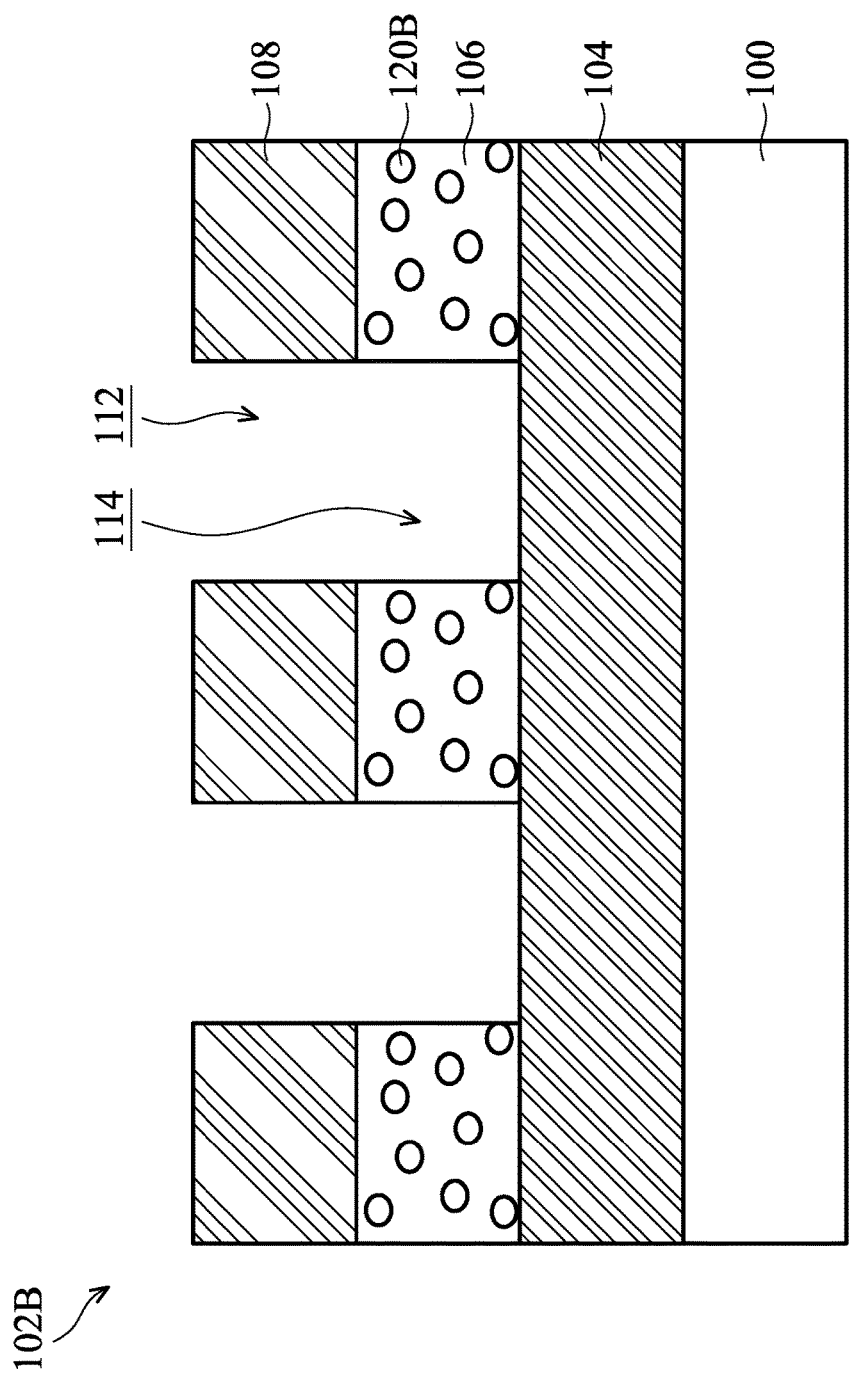

Afterward, as shown in FIG. 2F, by using the patterned upper layer 108 as a mask and a method that is the same as or similar to that in FIG. 1C, one (or more) portion of the middle layer 106 is etched. As shown in FIG. 2F, the portion of the middle layer 106 exposed by the first opening 112 of the patterned upper layer 108 is etched, in accordance with some embodiments. In some embodiments, one (or more) second opening 114 is formed in the middle layer 106 during the etching process. In some embodiments, the second opening 114 exposes a portion of the under layer 104. In some embodiments, the etched middle layer 106 has a second pattern. In some embodiments, after the etching process, the second pattern is the same as the first pattern.

Figure 2G:
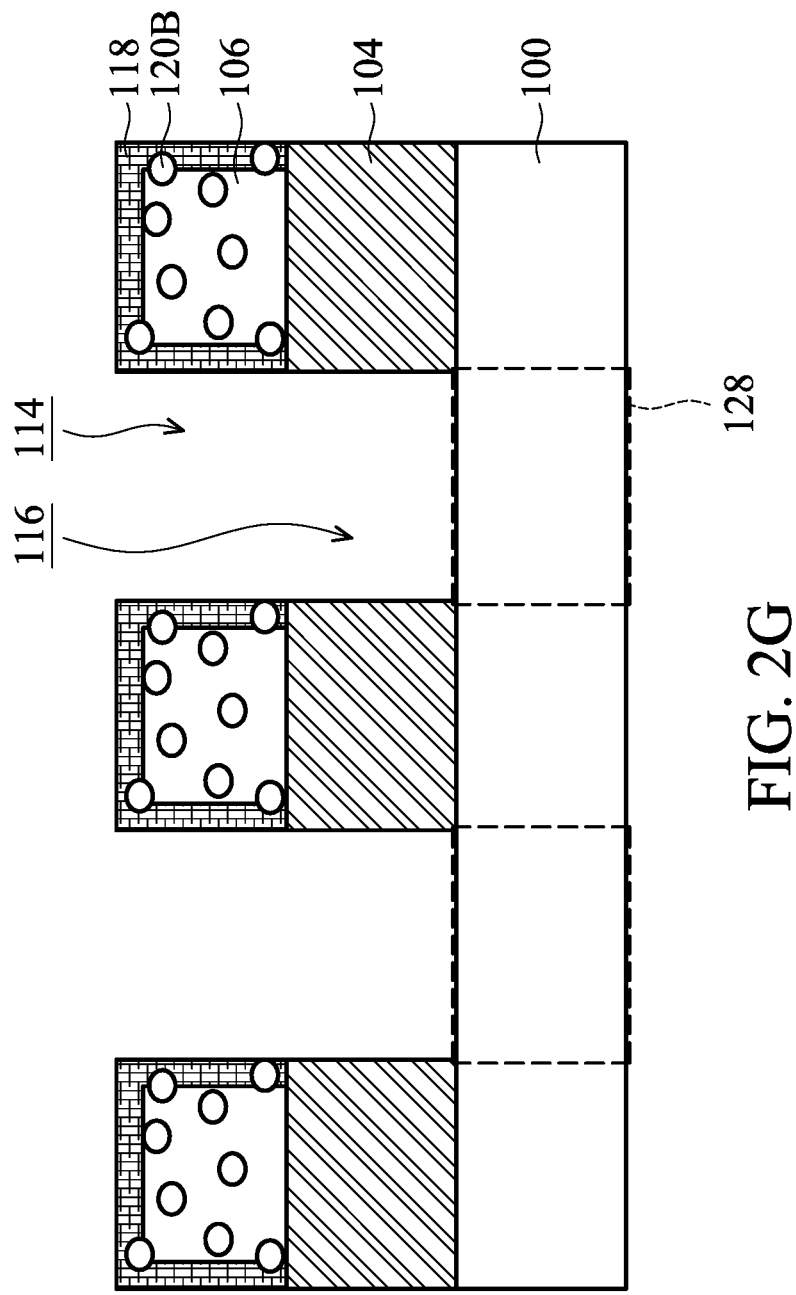

Afterward, as shown in FIG. 2G, by using the middle layer 106 having the second opening 114 as a mask and using a method that is the same as or similar to that in FIG. 1D, one (or more) portion of the under layer 104 106 is etched. As shown in FIG. 2G, the portion of the under layer 104 exposed by the second opening 114 is etched, in accordance with some embodiments. In some embodiments, one (or more) third opening 116 is formed in the under layer 104 during the etching process. In some embodiments, the third opening 116 exposes a portion 128 of the substrate 100. In some embodiments, the etched under layer 104 has a third pattern. In some embodiments, the third pattern is the same as the second pattern of the middle layer 106.

In some embodiments, an etching process is applied to remove material of the under layer 104 exposed by the second opening 114 of the middle layer 106. In some embodiments, the etching process uses an oxygen dry etch. In some embodiments, the etching process is a reactive ion etching process, a plasma etching process, any other applicable etching process, or a combination thereof.

As shown in FIG. 2G, during the etching process which etches the under layer 104, the upper layer 108 is removed, in accordance with some embodiments. As shown in FIG. 2G, during the etching process which etches the under layer 104, a surface layer 118 is formed at the surface of the middle layer 106, in accordance with some embodiments. In some embodiments, the surface layer 118 is positioned at the top surface and the side surface of the middle layer 106. As shown in FIG. 2G, some of the pores 120B is in the surface layer 118 of the middle layer 106, in accordance with some embodiments.

Figure 2H:
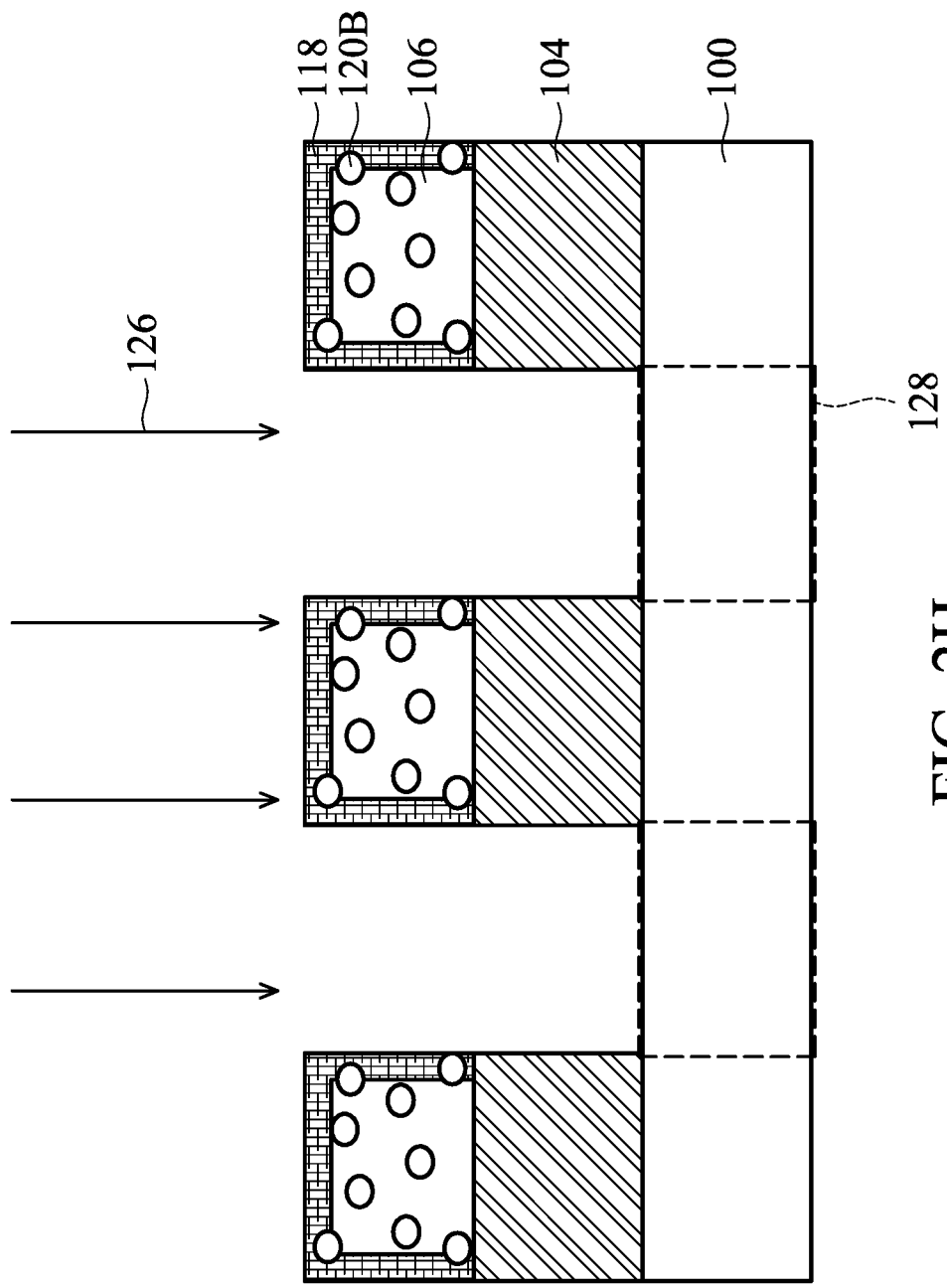

As shown in FIG. 2H, in some embodiments, one or more processes 126 are performed on the portion 128 of the substrate 100 exposed by the third opening 116 of the under layer 104, in accordance with some embodiments. In some embodiments, the substrate 100 is etched by using the under layer 104 having the third opening 116 as a mask to form one or more trenches. In some embodiments, the substrate 100 is etched by using an applicable etching process including a dry etch or a wet etch. In some embodiments, fins for a fin-type field effect transistor are formed in the substrate 100 by the etching process mentioned above.

In some other embodiments, the portion 128 of the substrate 100 exposed by the third opening 116 of the under layer 104 is implanted. In some other embodiments, a material layer such as a conductive layer, a semiconductor layer or a dielectric layer is deposited over the portion 128 of the substrate 100 exposed by the third opening 116 of the under layer 104. However, the embodiments of the present disclosure are not limit thereto. The process 126 may be any other applicable manufacturing process.

Figure 2I:
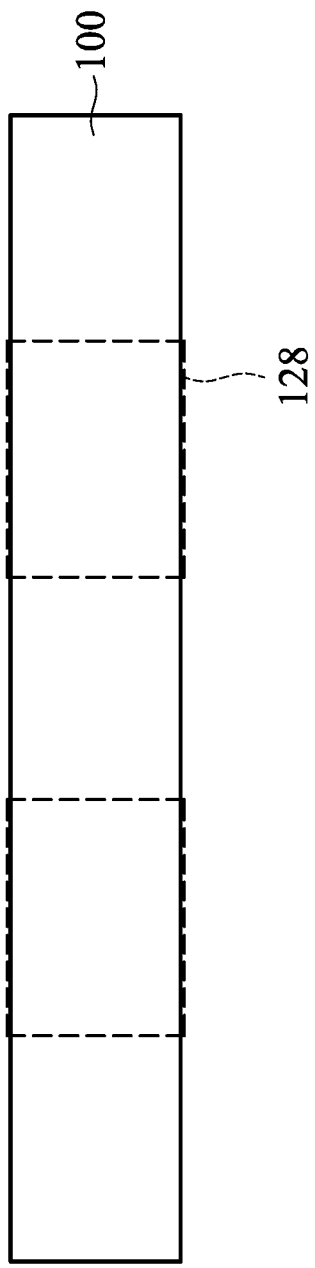

As shown in FIG. 2I, the middle layer 106 and the under layer 104 are removed using a method that is the same as or similar to that in FIG. 1F. In some embodiments, the middle layer 106 and the under layer 104 are removed by a wet etching process using an aqueous etchant.

In some cases, during the removal of the middle layer 106 and the under layer 104, since the middle layer 106 contains the pores 120B, the etchant osmosis may be enhanced due to the greater surface area resulting from the pores 120B. Therefore, the middle layer 106 containing the pores 120B has a better wet strippability and may be efficiently removed.

FIGS. 3A-3I are cross-sectional views of various stages of a process for forming a semiconductor device structure, in accordance with some embodiments. Note that the same or similar elements or layers corresponding to those of the semiconductor device are denoted by like reference numerals. The same or similar elements or layers denoted by like reference numerals have the same meaning and will not be repeated for the sake of brevity.

Figure 3A:
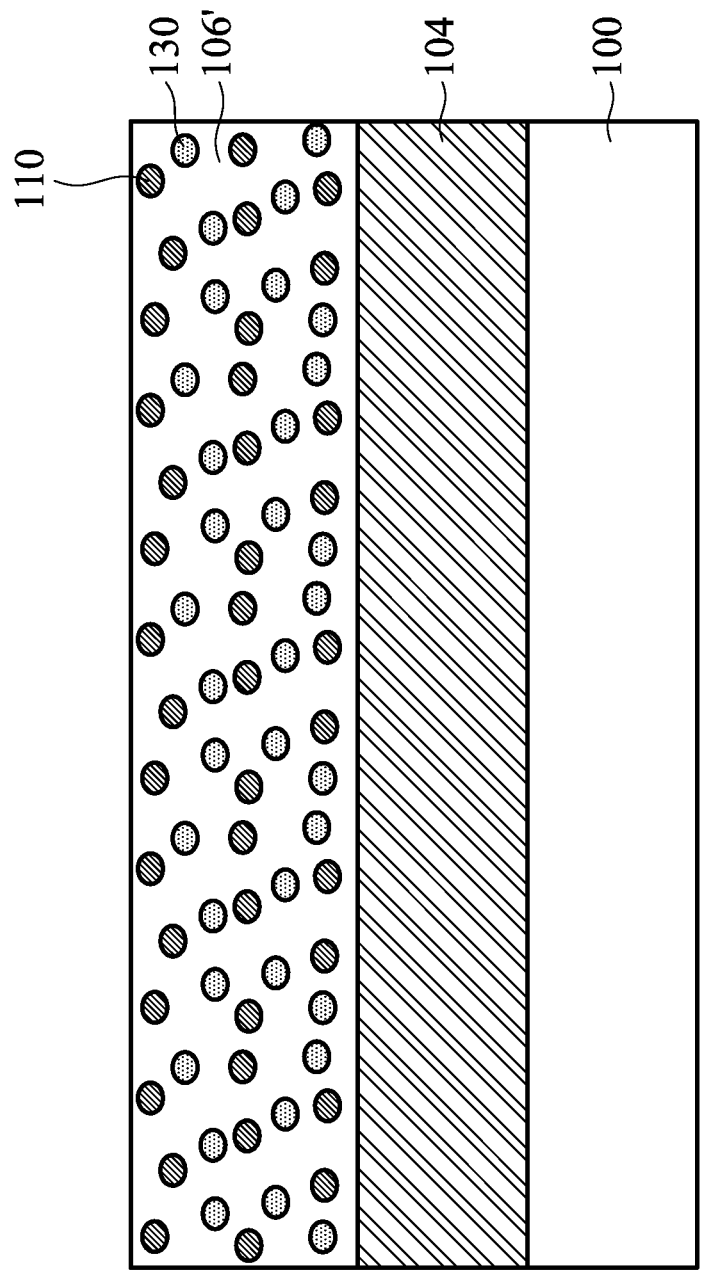
FIGS. 3A-3I are cross-sectional views of various stages of a process for forming a semiconductor device structure, in accordance with some embodiments.

As shown in FIG. 3A, after the under layer 104 is deposited over the substrate 100, a silicon-containing material layer 106' is deposited over the under layer 104, in accordance with some embodiments. In some embodiments, the silicon-containing material layer 106' includes the component which is used to form the subsequent middle layer (or the silicon-containing layer). In some embodiments, the silicon-containing material layer 106' includes a first solvent and a second solvent 130. In some embodiments, the under layer 104 is not formed.

In some embodiments, the boiling point of the second solvent 130 is higher than the boiling point of the first solvent. In some embodiments, the boiling point of the first solvent is in a range from about 80° C. to about 220° C., for example from about 100° C. to about 200° C. In some embodiments, the boiling point of the second solvent 130 is in a range from about 180° C. to about 320° C., for example from about 200° C. to about 300° C.

In some embodiments, the first solvent includes propylene glycol monomethyl ether acetate (PGMEA), propylene glycol monoethyl ether (PGEE), propylene Glycol Methyl Ether (PGME), butanol, isobutanol, isopentanol, isopropyl alcohol, any other suitable solvent with a boiling point ranging from about 80° C. to about 220° C., or a combination thereof.

In some embodiments, the second solvent 130 includes di(ethylene)glycol monomethyl ether, γ-butyrolactone, di(propylene)glycol monomethyl ether, hexamethylphosphoramide, tetradecane, tri(ethylene)glycol monomethyl ether, tri(propylene)glycol monomethyl ether, glycerol, tetra(ethylene)glycol monomethyl ether, any other suitable solvent with a boiling point ranging from about 180° C. to about 320° C., or a combination thereof.

As shown in FIG. 3A, the silicon-containing material layer 106' also includes hydrophilic additives 110, in accordance with some embodiments. In some embodiments, the hydrophilic additives 110 includes poly(γ-caprolactone), poly(ethylene oxide), poly(propylene oxide), random poly(ethylene oxide-propylene oxide), alternating poly(ethylene oxide-propylene oxide), block poly(ethylene oxide-propylene oxide), cyclodextrin, another suitable hydrophilic additive, or a combination thereof.

In some embodiments, the silicon-containing material layer 106' is a wet film and is also referred to as a silicon-containing material solution 106.

Figure 3B:
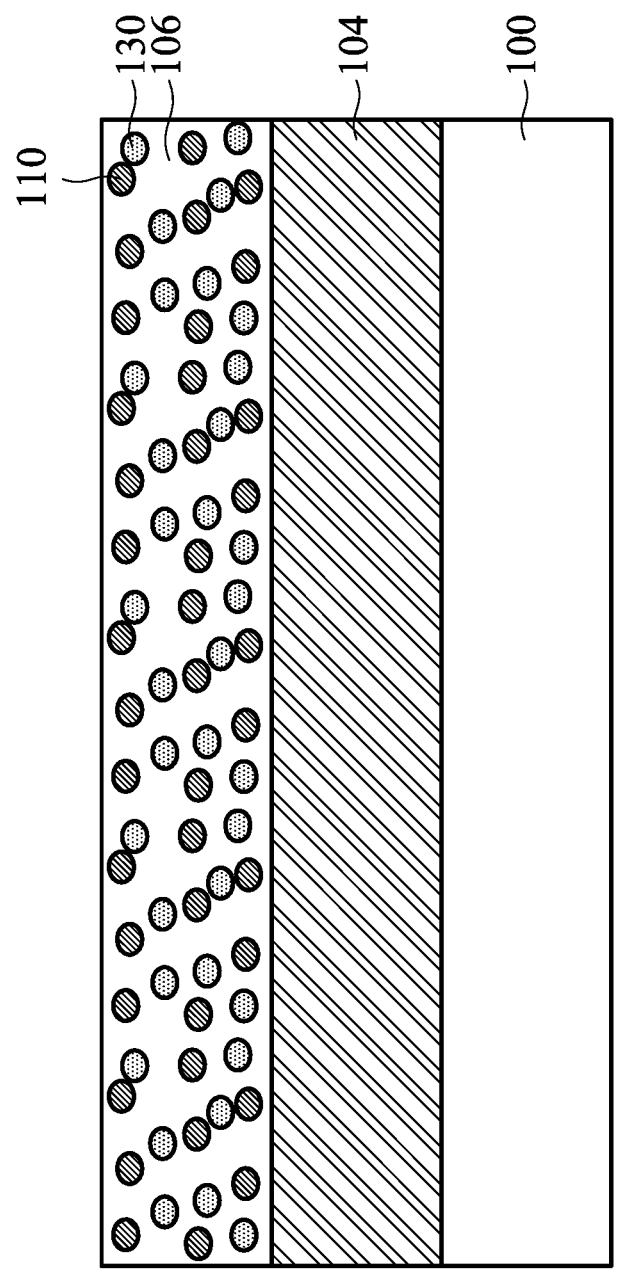

As shown in FIG. 3B, the silicon-containing material layer 106' is baked at a first temperature to remove the first solvent to form the middle layer 106 over the under layer 104, in accordance with some embodiments. In some embodiments, since the first solvent is removed from the silicon-containing material layer 106' during the baking process, the thickness of the middle layer 106 is less than the thickness of the silicon-containing material layer 106'.

In some embodiments, the first temperature is higher than or equal to the boiling point of the first solvent, and is less than the boiling point of the second solvent 130. Therefore, during the baking process at the first temperature, the first solvent is removed, while the second solvent 130 remains. In some embodiments, the first temperature is in a range from about 80° C. to about 220° C., for example, from about 160° C. to about 200° C.

In some embodiments, the weight percent of the second solvent 130 in the middle layer 106 is in a range from about 1 wt % to about 40 wt %, for example, from about 10 wt % to about 30 wt %, based on the total weight of the middle layer 106.

In some embodiments, the weight percent of the hydrophilic additives 110 in the middle layer 106 is in a range from about 1 wt % to about 40 wt %, for example, from about 10 wt % to about 30 wt %, based on the total weight of the middle layer 106.

Figure 3C:
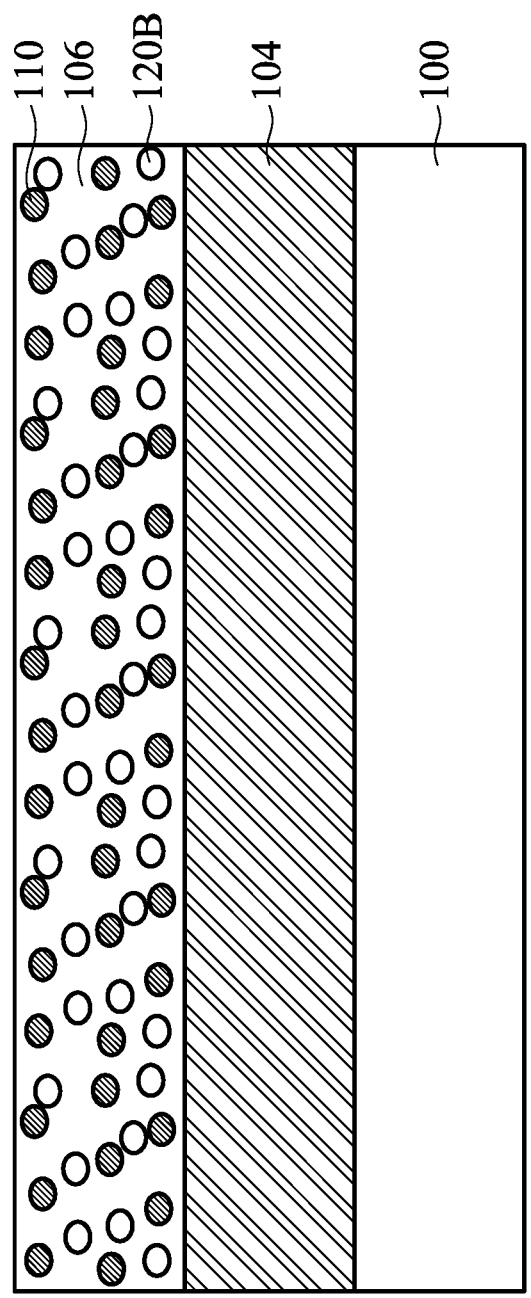

As shown in FIG. 3C, the middle layer 106 is baked at a second temperature to remove the second solvent 130 to form multiple first pores 120B in the middle layer 106. In some embodiments, the second temperature is higher than the first temperature. In some embodiments, the second temperature is in a range from about 180° C. to about 320° C., for example, from about 200° C. to about 300° C. In some embodiments, the second temperature is higher than or equal to the boiling point of the second solvent 130. In some embodiments, the pore density of the first pores 120B formed by removing the second solvent 130 is uniform in the middle layer 106.

Figure 3D:
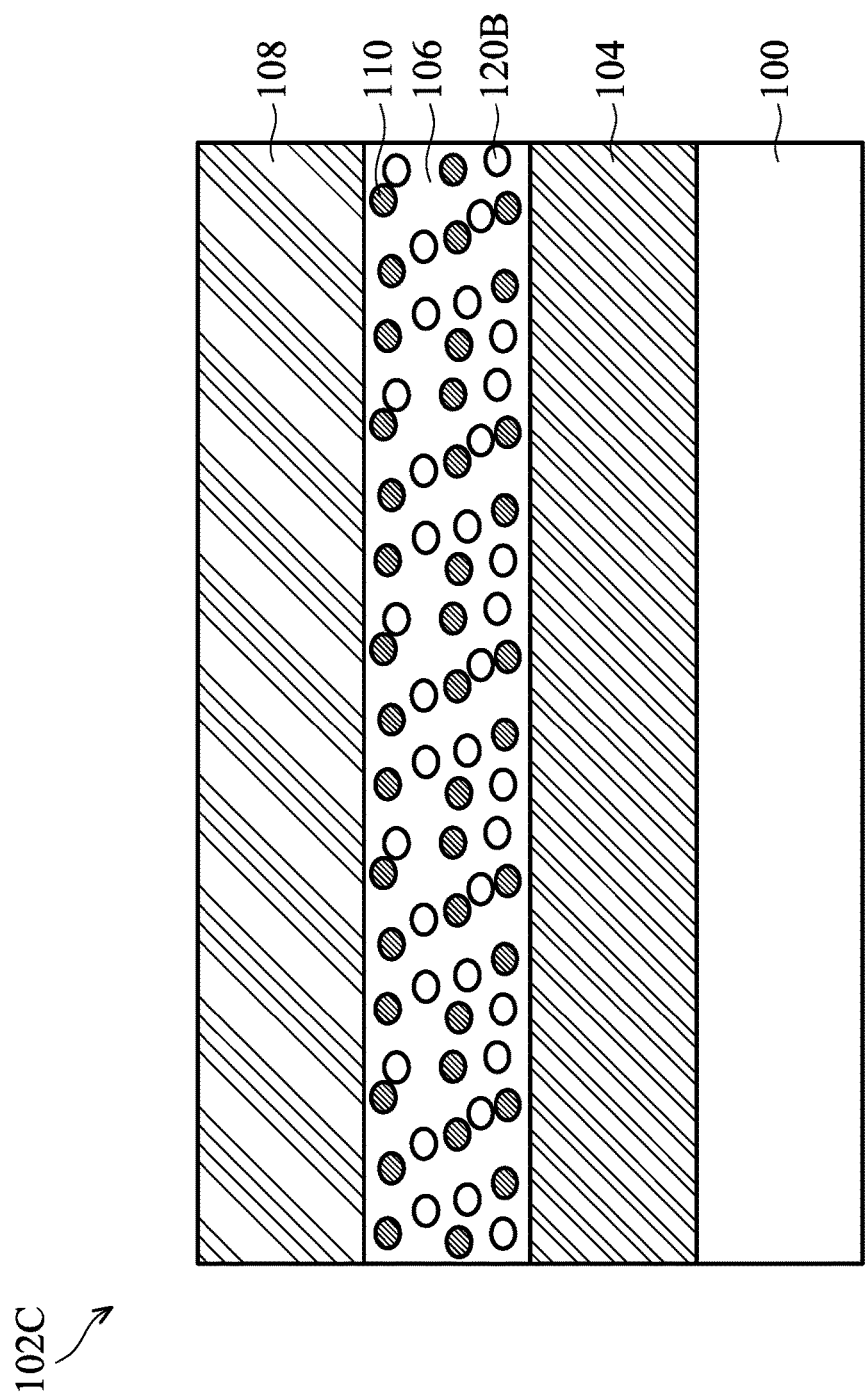
Figure 3E:
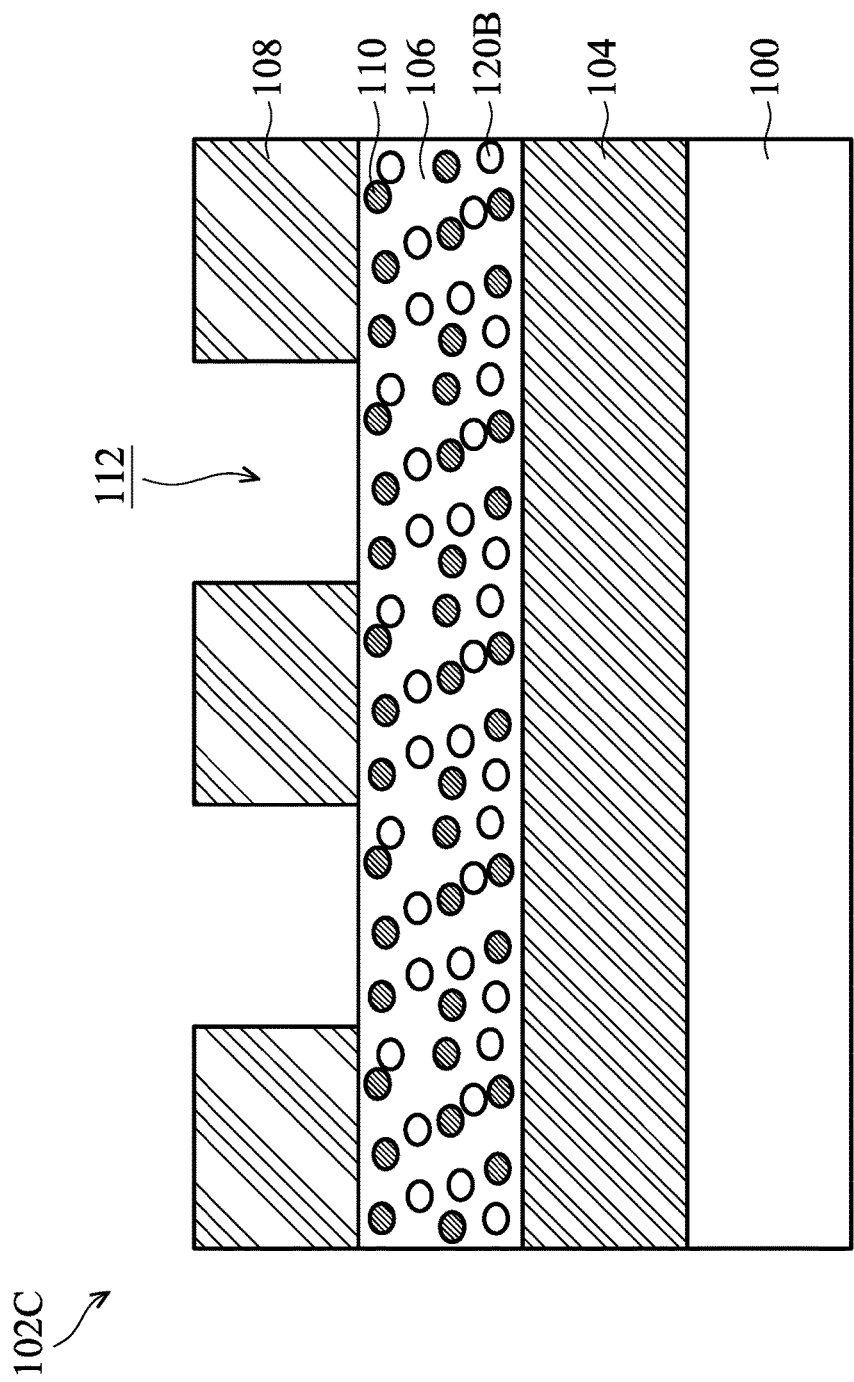

As shown in FIG. 3D, the upper layer 108 is deposited over the middle layer 106 to form a patterning stack 102C using a method that is the same as or similar to that in FIG. 1A, in accordance with some embodiments. Afterward, as shown in FIG. 3E, the upper layer 108 is patterned and developed to form one (or more) first opening 112 in the upper layer 108, in accordance with some embodiments. In some embodiments, the upper layer 108 is patterned and developed using a method that is the same as or similar to that in FIG. 1B. In some embodiments, the first opening 112 exposes a portion of the middle layer 106. In some embodiments, the patterned upper layer 108 has a first pattern.

Figure 3F:
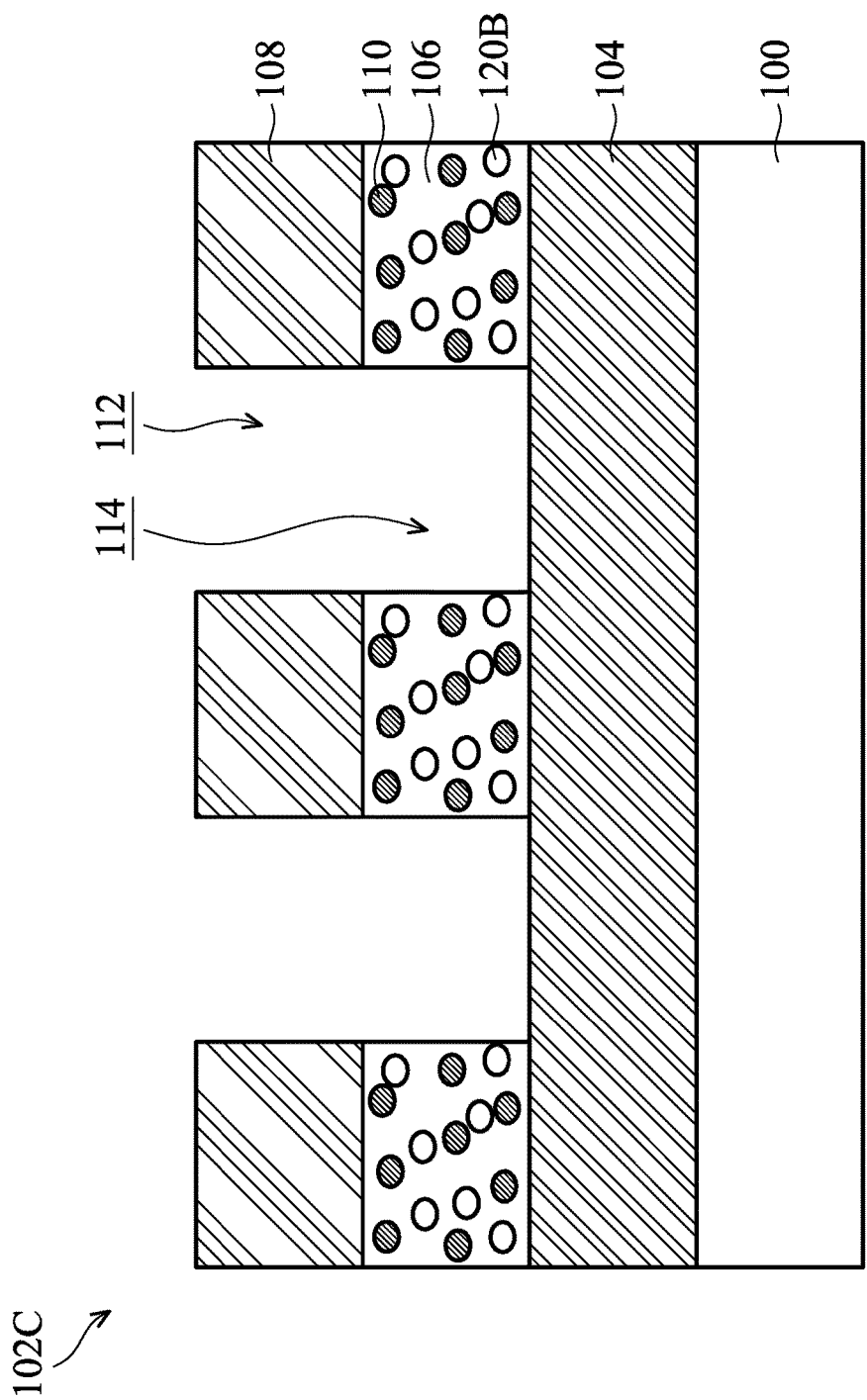

Afterward, as shown in FIG. 3F, by using the patterned upper layer 108 as a mask and a method that is the same as or similar to that in FIG. 1C, the portion of the middle layer 106 exposed by the first opening 112 of the patterned upper layer 108 is etched to form one (or more) second opening 114 in the middle layer 106, in accordance with some embodiments. In some embodiments, the second opening 114 exposes a portion of the under layer 104.

Figure 3G:
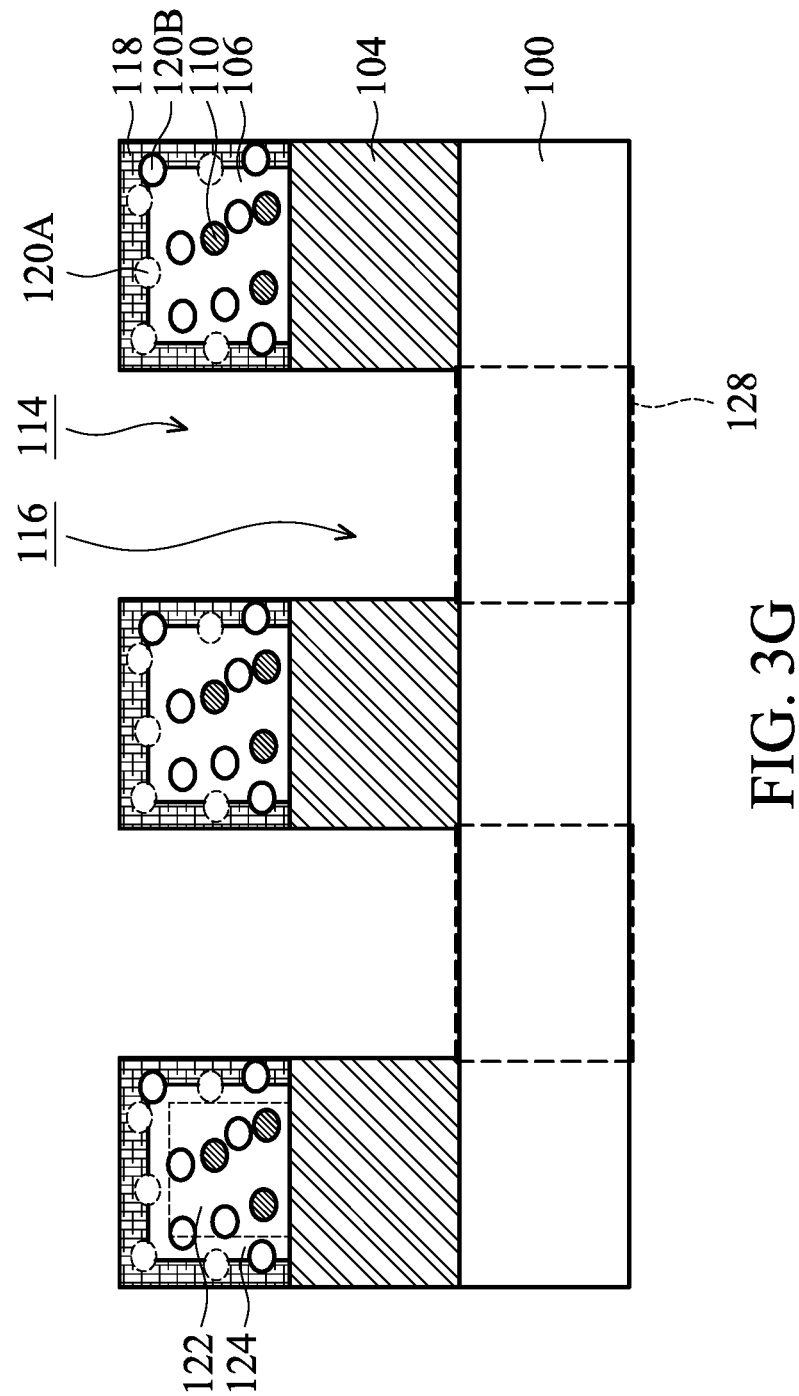

Afterward, as shown in FIG. 3G, by using the middle layer 106 having the second opening 114 as a mask and using a method that is the same as or similar to that in FIG. 1D, one (or more) portion of the under layer 104 is etched. As shown in FIG. 3G, the portion of the under layer 104 exposed by the second opening 114 is etched, in accordance with some embodiments. In some embodiments, one (or more) third opening 116 is formed in the under layer 104 during the etching process. In some embodiments, the third opening 116 exposes a portion 128 of the substrate 100.

In some embodiments, an etching process is applied to remove material of the under layer 104 exposed by the second opening 114 of the middle layer 106. In some embodiments, the etching process uses an oxygen dry etch. In some embodiments, the etching process is a reactive ion etching process, a plasma etching process, any other applicable etching process, or a combination thereof.

As shown in FIG. 3G, during the etching process which etches the under layer 104, the upper layer 108 is removed, in accordance with some embodiments. As shown in FIG. 3G, during the etching process which etches the under layer 104, a surface layer 118 is formed at the surface of the middle layer 106, in accordance with some embodiments.

As shown in FIG. 3G, multiple second pores 120A are formed in the middle layer 106 during the etching process which etches the portion of the under layer 104 exposed by the second opening 114 of the middle layer 106.

In some embodiments, during the etching process which etches the under layer 104, about 1% to about 20% of the hydrophilic additives 110 are removed. In some embodiments, during the etching process which etches the under layer 104, about 5% to about 10% of the hydrophilic additives 110 are removed.

In some cases, during a subsequent removal process which is used to remove the middle layer 106 and the under layer 104, since the middle layer 106 contains the first pores 120B and the second pores 120A, the etchant osmosis may be enhanced due to the greater surface area resulting from the first pores 120B and the second pores 120A. Therefore, the middle layer 106 containing the first pores 120B and the second pores 120A has a better wet strippability and may be efficiently removed.

In some embodiments, the first pores 120B and the second pores 120A have a total pore volume, and the ratio of the total pore volume to the total volume of the middle layer 106 is in a range from about 0.1% to about 10%, for example, from about 1% to about 5%.

In some cases, if the ratio of the total pore volume to the total volume of the middle layer 106 is too great, for example greater than 10%, the structural reliability of the middle layer 106 may be negatively affected. However, in some cases, if the ratio of the total pore volume to the total volume of the middle layer 106 is too small, for example less than 0.1%, the middle layer 106 may not be efficiently removed during a subsequent removal process which is used to remove the middle layer 106 and the under layer 104.

In some cases, during a subsequent removal process which is used to remove the middle layer 106 and the under layer 104, the hydrophilic additives 110 may enhance the penetration ability of the aqueous etchant into the middle layer 106. Therefore, the middle layer 106 containing the hydrophilic additives 110 has a better wet strippability and may be efficiently removed.

As shown in FIG. 3G, most of the second pores 120A formed by removing the hydrophilic additives 110 are in the region adjacent to the top surface and the side surface of the middle layer 106, in accordance with some embodiments. As shown in FIG. 3G, the middle layer 106 has an inner portion 122 and an outer portion 124 surrounding the inner portion 122, in accordance with some embodiments. As shown in FIG. 3G, in some embodiments, the pore density of second pores 120A of the outer portion 124 is greater than that of the inner portion 122. In some embodiments, the pore density decreases along a direction from the top surface and the side surface of the middle layer 106 to the inner portion 122 of the middle layer 106.

Figure 3H:
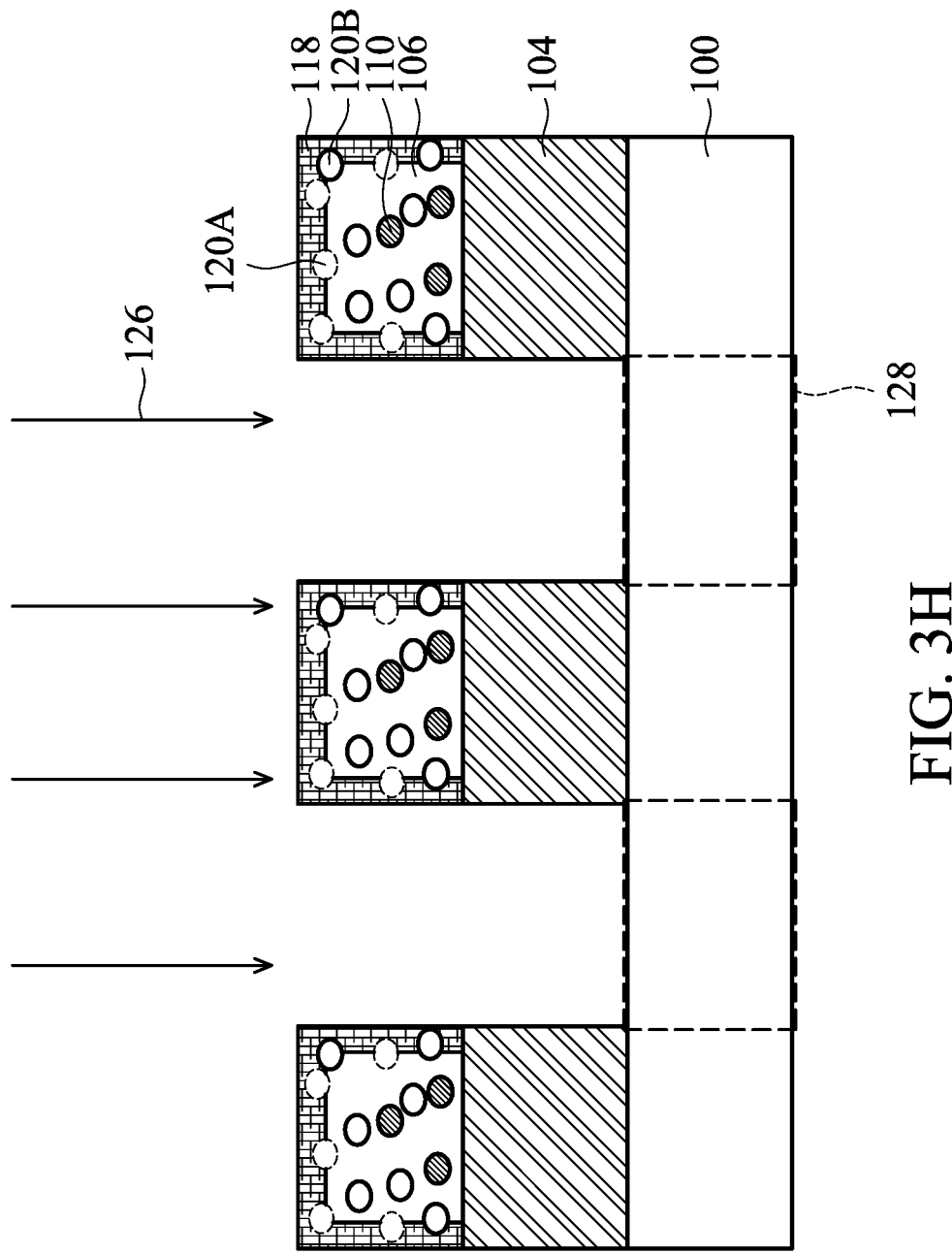

As shown in FIG. 3H, in some embodiments, one or more processes 126 are performed on the portion 128 of the substrate 100 exposed by the third opening 116 of the under layer 104, in accordance with some embodiments.

Figure 3I:
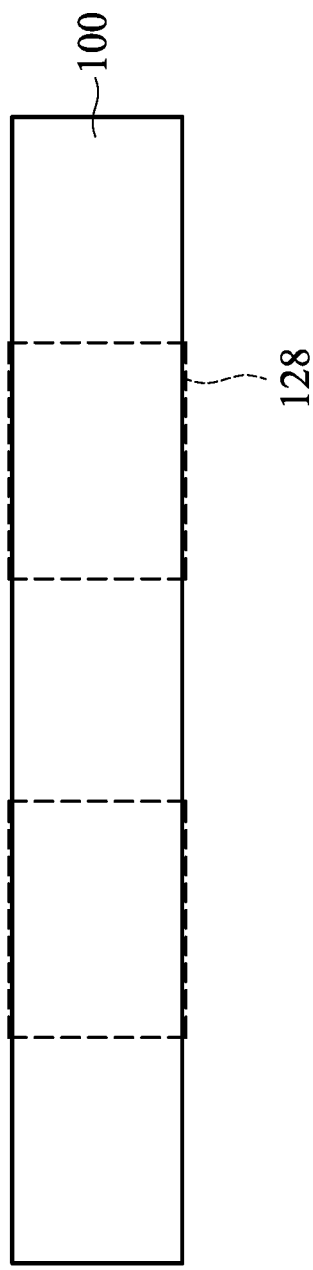

As shown in FIG. 3I, the middle layer 106 and the under layer 104 are removed using a method that is the same as or similar to that in FIG. 1F. In some embodiments, the middle layer 106 and the under layer 104 are removed by a wet etching process using an aqueous etchant.

Embodiments of the disclosure form pores in the middle layer, therefore, during the removal of the middle layer and the under layer, since the middle layer contains the pores, the etchant osmosis may be enhanced due to the greater surface area resulting from the pores. Therefore, the middle layer containing the pores has a better wet strippability and may be efficiently removed.

In some cases, during the removal of the middle layer and the under layer, since the middle layer contains the hydrophilic additives, the penetration ability of the aqueous etchant into the middle layer may be enhanced. Therefore, the middle layer containing the hydrophilic additives has a better wet strippability and may be efficiently removed. In some embodiments, the etching rate of the middle layer containing the hydrophilic additives and the pores is 450% greater than that of a middle layer which does not contain the hydrophilic additives and pores.

In accordance with some embodiments, a method for forming a semiconductor device structure is provided. The method includes forming an under layer over a substrate, forming a middle layer over the under layer, and forming a patterned upper layer over the middle layer. The patterned upper layer has a first opening exposing a portion of the middle layer. The method also includes etching the portion of the middle layer exposed by the first opening to form a second opening exposing a portion of the under layer. The method also includes etching the portion of the under layer exposed by the second opening of the middle layer. The method further includes forming pores in the middle layer before or during the etching of the portion of the under layer.

In accordance with some embodiments, a method for forming a semiconductor device structure is provided. The method includes forming a silicon-containing material layer over a substrate. The silicon-containing material layer includes a first solvent and a second solvent, and a boiling point of the second solvent is higher than a boiling point of the first solvent. The method also includes baking the silicon-containing material layer at a first temperature to remove the first solvent to form a silicon-containing layer over the substrate. The method also includes baking the silicon-containing layer at a second temperature to remove the second solvent to form pores in the silicon-containing layer. The method further includes forming a photoresist layer over the silicon-containing layer, and developing the photoresist layer to form a first opening exposing a portion of the silicon-containing layer.

In accordance with some embodiments, a method for forming a semiconductor device structure is provided. The method includes forming an organic layer over a substrate, and forming a silicon-containing layer over the organic layer. The silicon-containing layer includes a plurality of hydrophilic additives. The method also includes forming a photoresist layer over the silicon-containing layer, and removing a portion of the hydrophilic additives to form pores in the silicon-containing layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
    forming an under layer over a substrate;
    forming a middle layer over the under layer, wherein the middle layer comprises a plurality of hydrophilic additives;
    forming a patterned upper layer over the middle layer, wherein the patterned upper layer has a first opening exposing a portion of the middle layer;
    etching the portion of the middle layer exposed by the first opening to form a second opening exposing a portion of the under layer; and
    etching the portion of the under layer exposed by the second opening of the middle layer,
    wherein some hydrophilic additives are removed from the middle layer to form a plurality of the pores in the middle layer, while other hydrophilic additives remain in the middle layer.

2. The method as claimed in claim 1, wherein the middle layer is a silicon-containing layer.

3. The method as claimed in claim 2, wherein the plurality of the pores has a total pore volume, and a ratio of the total pore volume to a total volume of the silicon-containing layer is in a range from about 0.1% to about 10%.

4. The method as claimed in claim 1, wherein during the etching process which etches the under layer, an etch rate of the plurality of the hydrophilic additives is higher than an etch rate of component of the middle layer other than the hydrophilic additives.

5. The method as claimed in claim 1, wherein the plurality of the hydrophilic additives comprises poly(γ-caprolactone), poly(ethylene oxide), poly(propylene oxide), random poly(ethylene oxide-propylene oxide), alternating poly(ethylene oxide-propylene oxide), block poly(ethylene oxide-propylene oxide), cyclodextrin, or a combination thereof.

6. The method as claimed in claim 1, wherein the formation of the middle layer comprises:
forming a silicon-containing material layer over the under layer, wherein the silicon-containing material layer comprises a first solvent and a second solvent, wherein a boiling point of the second solvent is higher than a boiling point of the first solvent;
baking the silicon-containing material layer at a first temperature to remove the first solvent to form the middle layer over the under layer; and
baking the middle layer at a second temperature to remove the second solvent to form at least a portion of the plurality of the pores in the middle layer.

7. The method as claimed in claim 6, wherein the middle layer is baked before the formation of the patterned upper layer.

8. The method as claimed in claim 6, wherein the first solvent comprises propylene glycol monomethyl ether acetate (PGMEA), propylene glycol monoethyl ether (PGEE), propylene Glycol Methyl Ether (PGME), butanol, isobutanol, isopentanol, isopropyl alcohol, or a combination thereof.

9. The method as claimed in claim 6, wherein the second solvent comprises di(ethylene)glycol monomethyl ether, γ-butyrolactone, di(propylene)glycol monomethyl ether, hexamethylphosphoramide, tetradecane, tri(ethylene)glycol monomethyl ether, tri(propylene)glycol monomethyl ether, glycerol, tetra(ethylene)glycol monomethyl ether, or a combination thereof.

10. A method for forming a semiconductor device structure, comprising:
forming an organic layer over the substrate;
forming a silicon-containing material layer over the organic layer, wherein the silicon-containing material layer comprises a first solvent a second solvent and a plurality of hydrophilic additives, wherein a boiling point of the second solvent is higher than a boiling point of the first solvent;
baking the silicon-containing material layer at a first temperature to remove the first solvent to form a silicon-containing layer over the substrate;
baking the silicon-containing layer at a second temperature to remove the second solvent to form a plurality of first pores in the silicon-containing layer;
forming a photoresist layer over the silicon-containing layer;
developing the photoresist layer to form a first opening exposing a portion of the silicon-containing layer;
etching the portion of the silicon-containing layer exposed by the first opening of the photoresist layer to form a second opening exposing a portion of the organic layer; and
etching the portion of the organic layer exposed by the second opening of the silicon-containing layer,
wherein during the etching process which etches the organic layer, at least a portion of the plurality of the hydrophilic additives is removed from the silicon-containing layer to form a plurality of second pores in the silicon-containing layer.

11. The method as claimed in claim 10, wherein the second temperature is higher than the first temperature.

12. The method as claimed in claim 10, wherein the first temperature is in a range from about 80° C. to about 220° C., and the second temperature is in a range from about 180° C. to about 320° C.

13. The method as claimed in claim 10, wherein the silicon-containing layer has an inner portion and an outer portion surrounding the inner portion,
wherein a pore density of second pores of the outer portion is greater than that of the inner portion.

14. A method for forming a semiconductor device structure, comprising:
forming an organic layer over a substrate;
forming a silicon-containing layer over the organic layer, wherein the silicon-containing layer comprises a plurality of hydrophilic additives, and wherein the silicon-containing layer has an inner portion and an outer portion surrounding the inner portion, and a pore density of the outer portion is greater than a pore density of the inner portion;
forming a photoresist layer over the silicon-containing layer; and
removing a portion of the plurality of the hydrophilic additives to form a plurality of pores in the silicon-containing layer.

15. The method as claimed in claim 14, wherein the pore density decreases along a direction from a surface of the silicon-containing layer to the inner portion of the silicon-containing layer.

* * * * *